(12) United States Patent
Kim et al.

(10) Patent No.: US 9,025,124 B2
(45) Date of Patent: May 5, 2015

(54) DISPLAY SUBSTRATE AND METHOD OF MANUFACTURING THE SAME

(75) Inventors: Sung-Man Kim, Seoul (KR); Jun-Ho Song, Seongnam-si (KR); Man-Hong Na, Seoul (KR); Young-Je Cho, Asan-si (KR); Hoon Kang, Suwon-si (KR); Sung-Hoon Lim, Gunsan-si (KR); Min-Chul Song, Seoul (KR); Soo-Jung Chae, Seoul (KR); Eu-Gene Lee, Busan (KR)

(73) Assignee: Samsung Display Co., Ltd. (KR)

( * ) Notice: Subject to any disclaimer, the term of this patent is extended or adjusted under 35 U.S.C. 154(b) by 366 days.

(21) Appl. No.: 13/440,499

(22) Filed: Apr. 5, 2012

(65) Prior Publication Data

US 2013/0043473 A1 Feb. 21, 2013

(30) Foreign Application Priority Data

Aug. 17, 2011 (KR) .......................... 10-2011-0081644

(51) Int. Cl.
*G02F 1/1345* (2006.01)
*H01L 27/12* (2006.01)
*G02F 1/1362* (2006.01)
*H01L 29/417* (2006.01)

(52) U.S. Cl.
CPC .......... *H01L 27/1288* (2013.01); *G02F 1/1345* (2013.01); *H01L 27/124* (2013.01); *G02F 1/13458* (2013.01); *G02F 1/136227* (2013.01); *H01L 29/41733* (2013.01)

(58) Field of Classification Search
USPC .......................................... 349/152
See application file for complete search history.

(56) References Cited

U.S. PATENT DOCUMENTS

| 6,849,873 | B2 | 2/2005 | Back et al. |
|---|---|---|---|
| 2005/0206821 | A1* | 9/2005 | Lai ................ 349/139 |
| 2008/0137016 | A1 | 6/2008 | Kim et al. |
| 2008/0157364 | A1* | 7/2008 | Yang et al. ........... 257/741 |
| 2009/0167975 | A1 | 7/2009 | Lee et al. |

FOREIGN PATENT DOCUMENTS

KR 1020050079134 A 8/2005

* cited by examiner

*Primary Examiner* — Wen-Ying P Chen
(74) *Attorney, Agent, or Firm* — Cantor Colburn LLP

(57) ABSTRACT

A display substrate includes a data line, a gate line and a fan-out line. The data line is disposed in a display area of a base substrate and transfers a data signal to a switching element electrically connected to a pixel electrode. The gate line is disposed in the display area and transfers a gate signal to the switching element. The fan-out line is disposed in a peripheral area of the base substrate surrounding the display area, electrically connected to at least one of the data line and the gate line, and includes a plurality of conductive layers making contact with each other through a contact hole.

15 Claims, 38 Drawing Sheets

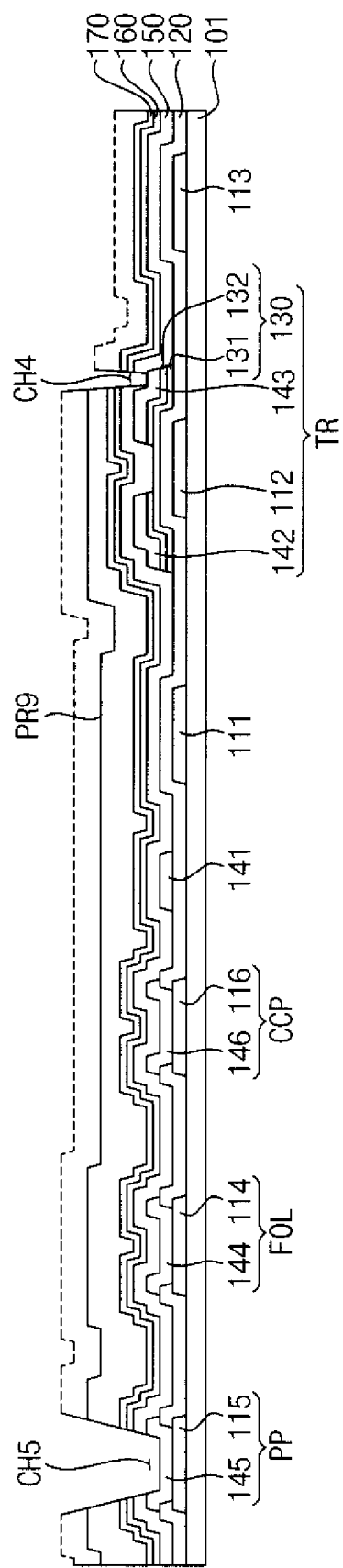

DISPLAY SUBSTRATE AND METHOD OF MANUFACTURING THE SAME

This application claims priority to Korean Patent Application No. 2011-0081644, filed on Aug. 17, 2011, and all the benefits accruing therefrom under 35 U.S.C. §119, the contents of which are herein incorporated by reference in their entireties.

BACKGROUND OF THE INVENTION

1. Field of the Invention

Exemplary embodiments of the invention relate to a display substrate and a method of manufacturing of the display substrate. More particularly, exemplary embodiments of the invention relate to a display substrate in order to improve quality of an external appearance and a method of manufacturing the display substrate.

2. Description of the Related Art

Generally, a liquid crystal display ("LCD") apparatus includes an LCD panel displaying an image using a light transmittance of a liquid crystal and a backlight assembly disposed under the LCD panel and providing a light to the LCD panel.

The LCD panel includes a display area displaying the image, and a peripheral area surrounding the display area. A driving circuit or a chip driving the LCD panel may be mounted in the peripheral area. Generally, a blocking pattern such as a black matrix ("BM") pattern is disposed in the peripheral area. When the peripheral area increases, quality of an external appearance of the LCD apparatus may be decreased.

The LCD apparatus displays a three-dimensional ("3D") stereoscopic image as well as a two-dimensional ("2D") image as demands for the 3D stereoscopic image increase in the industrial field such as games, movies and so on. In displaying the 3D stereoscopic image, a wide peripheral area of the LCD panel may scatter one's concentration in watching the 3D stereoscopic image.

In addition, in a tiled display apparatus formed by connecting a plurality of LCD display panels with each other to obtain a large-sized screen, a frame line having a gray or a black may be recognized in a boundary area between the LCD panels of the wide peripheral area of the LCD panel. Color or luminance of the boundary area in which the frame line is viewed is not controlled so that an observer may easily recognize the frame line through his eyes. Thus, the display quality may be decreased.

BRIEF SUMMARY OF THE INVENTION

Exemplary embodiments of the invention provide a display substrate capable of improving quality of an external appearance and an aperture ratio.

Exemplary embodiments of the invention also provide a method of manufacturing the display substrate.

According to an exemplary embodiment of the invention, there is provided a display substrate. The display substrate includes a data line, a gate line and a fan-out line. The data line is disposed in a display area of a base substrate and transfers a data signal to a switching element electrically connected to a pixel electrode. The gate line is disposed in the display area and transfers a gate signal to the switching element. The fan-out line is disposed in a peripheral area of the base substrate surrounding the display area, electrically connected to at least one of the data line and the gate line, and included a plurality of conductive layers making contact with each other through a fan-out line contact hole.

In an exemplary embodiment, the fan-out line contact hole may elongated and extend in a longitudinal direction of the fan-out line.

In an exemplary embodiment, the display apparatus may further include a gate driving circuit disposed in the peripheral area. The gate driving circuit includes a plurality of circuit switching elements generating the gate signal, and a circuit contact part in which a first connection electrode extended from an electrode of a first circuit switching element makes contact with a second connection electrode extended from an electrode of a second circuit switching element, through a circuit part contact hole.

In an exemplary embodiment, the switching element may include a gate electrode extended from the gate line, a source electrode extended from the data line, and a drain electrode making contact with the pixel electrode through a switching element contact hole.

In an exemplary embodiment, the switching element may include a gate electrode making contact with to the gate line through a first contact hole, a source electrode making contact with the data line through a second contact hole, and a drain electrode making contact with the pixel electrode through a third contact hole.

According to another exemplary embodiment of the invention, a method of manufacturing a display substrate, includes forming a gate electrode of a switching element in a display area of a base substrate and a first conductive line of a fan-out line in a peripheral area of the base substrate using a first conductive layer, forming a gate insulating layer including a first contact hole through which the first conductive line is exposed, forming source and drain electrodes of the switching element in the display area and on the base substrate, and a second conductive line of the fan-out line making contact with the first conductive line through the first contact hole in the peripheral area, forming a protecting layer including a second contact hole through the drain electrode is exposed, and forming a pixel electrode making contact with the drain electrode through the second contact hole.

In an exemplary embodiment, the first contact hole of the gate insulating layer may be elongated and extend in a longitudinal direction of the fan-out line.

In an exemplary embodiment, the method may further includes forming a first connection electrode extended from a first circuit switching element of a gate driving circuit in the peripheral area using the first conductive layer, forming a third contact hole through which the first connection electrode is exposed through the gate insulating layer, and forming a second connection electrode extended from a second circuit switching element of the gate driving circuit and making contact with the first connection electrode through the third contact hole, using the second conductive layer.

In an exemplary embodiment, the method may further includes forming a gate line connected to the gate electrode in the display area using the first conductive layer, and forming a data line connected to the source electrode and crossing the gate line in the display area using the second conductive layer.

In an exemplary embodiment, the method may further includes forming a data line in the display area using the first conductive layer, forming a fourth contact hole through which the gate electrode is exposed and a fifth contact hole through which the data line is exposed through the gate insulating layer, and forming a gate line crossing the data line and making contact with the gate electrode through the fourth contact hole in the display area using the second conductive layer. The source electrode may make contact with the data line through the fifth contact hole.

In an exemplary embodiment, the method may further include forming a storage line substantially parallel to the gate line and overlapping with the data line using the second conductive layer.

In an exemplary embodiment, the method may further includes forming the gate insulating layer, a semiconductor layer and an ohmic contact layer on the base substrate on which the gate electrode is formed, forming the first and third contact holes using a first photo resist pattern including a first photo pattern and a second photo pattern thicker than the first photo pattern, etching the first photo resist pattern to form a third photo pattern on the gate electrode, and forming an active pattern including the semiconductor layer and the ohmic contact layer on the gate electrode using the third photo pattern.

In an exemplary embodiment, the method may further includes forming the second conductive layer on the base substrate on which the active pattern is formed, forming a switching electrode pattern overlapping with the first conductive line, the first connection electrode and the active pattern using a second photo resist pattern including a fourth photo pattern and a fifth photo pattern thicker than the fourth photo pattern, etching the second photo resist pattern to form a sixth photo pattern on the switching electrode pattern, and forming the source electrode and the drain electrode using the sixth photo pattern.

In an exemplary embodiment, the method may further includes forming a protecting layer, a blocking layer and a sacrificing layer on the base substrate on which the source and drain electrodes are formed, forming the second contact hole using a third photo resist pattern including a seventh photo pattern and an eighth photo pattern thicker than the seventh photo pattern, etching the third photo resist pattern to form a ninth photo pattern through which the sacrificing layer of an area in which the pixel electrode is formed is exposed, forming an under cut at a side of the sacrificing layer adjacent to a side of the ninth photo pattern, forming a third conductive layer on the base substrate on which the under cut is formed, and lifting off the ninth photo pattern using the under cut to form the pixel electrode.

In an exemplary embodiment, the method may further includes forming a protecting layer on the base substrate on which the source and drain electrodes are formed, forming a fourth photo resist pattern on the base substrate on which the protecting layer is formed, forming the second contact hole using the fourth photo resist pattern, forming a third conductive layer on the base substrate on which the second contact hole is formed, forming a fifth photo resist pattern on the base substrate on which the third conductive layer is formed, and forming the pixel electrode using the fifth photo resist pattern.

In an exemplary embodiment, the method may further includes forming the second conductive layer on the base substrate on which the active pattern is formed, and forming a switching electrode pattern overlapping with the first conductive line, the first connection electrode and the active pattern using a second photo resist pattern.

In an exemplary embodiment, the method may further includes forming a protecting layer and a sacrificing layer on the base substrate on which the source and drain electrodes are formed, forming the second contact hole using a third photo resist pattern including a seventh photo pattern and an eighth photo pattern thicker than the seventh photo pattern, etching the third photo resist pattern to form a ninth photo pattern through which the sacrificing layer of an area in which the pixel electrode is formed is exposed, forming an under cut at a side of the sacrificing layer adjacent to a side of the ninth photo pattern, forming a third conductive layer on the base substrate on which the under cut is formed, and lifting off the ninth photo pattern using the under cut to form the pixel electrode.

In an exemplary embodiment, the method may further includes forming the gate insulating layer, a semiconductor layer and an ohmic contact layer on the base substrate on which the gate electrode is formed, and forming the first and third contact holes using the first photo resist pattern.

In an exemplary embodiment, the method may further includes forming the second conductive layer on the base substrate on which the first and third contact holes are formed, forming the first conductive line, the first connection electrode, an active pattern and a switching electrode pattern overlapping with the active pattern using a second photo resist pattern including a fourth photo pattern and a fifth photo pattern thicker than the fourth photo pattern, etching the second photo resist pattern to form a sixth photo pattern on the switching electrode pattern, and forming the source and drain electrodes using the sixth photo pattern.

In an exemplary embodiment, the method may further includes forming a protecting layer and a sacrificing layer on the base substrate on which the source and drain electrodes are formed, forming the second contact hole using a third photo resist pattern including a seventh photo pattern and an eighth photo pattern thicker than the seventh photo pattern, etching the third photo resist pattern to form a ninth photo pattern through which the sacrificing layer of an area in which the pixel electrode is formed is exposed, forming an under cut at a side surface of the sacrificing layer adjacent to a side surface of the ninth photo pattern, forming a third conductive layer on the base substrate on which the under cut is formed, and lifting off the ninth photo pattern using the under cut to form the pixel electrode.

According to the invention, the display substrate includes a structure such that a plurality of conductive layers directly makes contact with each other through a contact hole, and thus areas of the gate driving circuit and the fan-out part disposed in the peripheral area of display substrate may be decreased. In addition, the distance between pixel electrodes adjacent to each other may be decreased so that the aperture ratio of the display panel may be improved.

BRIEF DESCRIPTION OF THE DRAWINGS

The above and other features and advantages of the invention will become more apparent by describing in detailed exemplary embodiments thereof with reference to the accompanying drawings, in which.

DETAILED DESCRIPTION OF THE INVENTION

Figure 1:
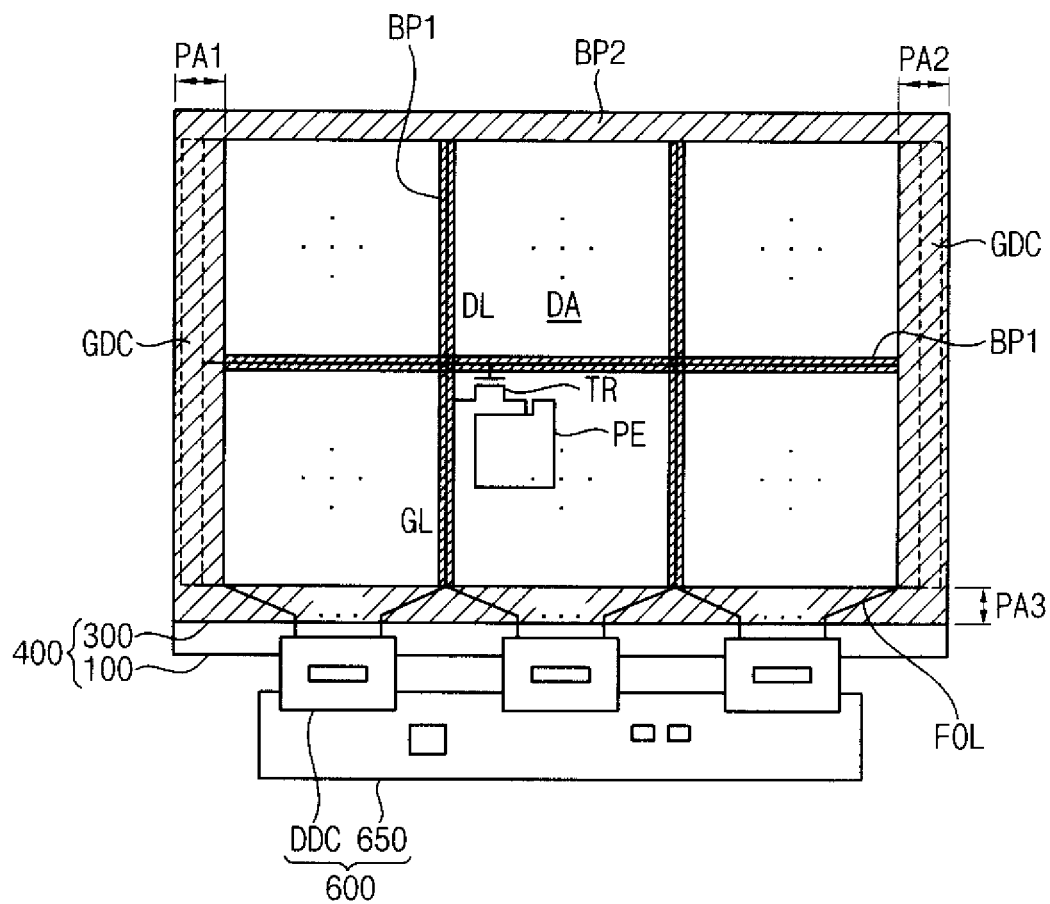
FIG. 1 is a plan view illustrating an exemplary embodiment of a display apparatus according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "under," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a plan view illustrating an exemplary embodiment of a display apparatus according to the invention.

Referring to FIG. 1, the display apparatus includes a display panel 400 and a panel driving part 600.

The display panel 400 includes a display substrate 100 and an opposing substrate 300. The display substrate 100 includes a display area DA, and a peripheral area PA surrounding to the display area DA.

In the display area DA, a plurality of signal lines, a plurality of switching elements TR for a display and a plurality of pixel electrodes PE are disposed. The signal lines include a plurality of data lines DL, and a plurality of gate lines GL crossing the data lines DL.

The peripheral area PA includes a first area PA1, a second area PA2 and a third area PA3. A gate driving circuit GDC generates a gate signal, provides the gate signal to the gate lines GL and is disposed in at least one of the first and second areas PA1 and PA2 opposite to each other. The gate driving circuit GDC includes a plurality of switching elements for a circuit formed via the process substantially same as that forming the switching element TR for the display, and a circuit contact part. The circuit contact part includes a first connection electrode extended from an electrode of a first circuit switching element and a second connection electrode extended from an electrode of a second circuit switching element, and the first and second connection electrodes directly making contact with each other through a contact hole. A contact area may be decreased by the circuit contact part having a directly contacting structure so that an area in which the gate driving circuit GDC is formed may be decreased.

In the third area PA3, a fan-out part including a plurality of fan-out lines FOL connected to the data lines, and a pad part including a plurality of pads connected to the fan-out lines are disposed.

The fan-out lines FOL includes a plurality of conductive layers electrically connected to the data lines DL and directly making contact with each other through a contact hole. The fan-out lines FOL include the conductive layers and have a relatively thick thickness and a relatively narrow width. Generally, when a thickness is thin and a width is narrow, a line resistance may be increased. The width of the fan-out lines FOL is decreased so that an area in which the fan-out lines FOL are formed may be decreased. As a result, for example, the third area PA3 may be decreased.

Therefore, the first, second and third areas PA1, PA2 and PA3, which are included in the peripheral area PA of the display panel 100 may be decreased so that a bezel of the display apparatus may be decreased.

The opposing substrate 300 is disposed opposite to the display substrate 100. The opposing substrate 300 includes an opposing display area corresponding to the display area DA and an opposing peripheral area corresponding to the peripheral area PA. A first blocking pattern BP1 is disposed in the opposing display area and a second blocking pattern BP2 is disposed in the opposing peripheral area. In the exemplary embodiment, for example, the first blocking pattern BP1 is disposed corresponding to an area in which the data lines DL and the gate lines GL are disposed, and the second blocking pattern BP2 is disposed corresponding to the peripheral area PA.

The panel driving part 600 includes a driving circuit DDC and a printed circuit substrate ("PCB") 650. The data driving circuit DDC includes a flexible printed circuit board ("FPCB") and a driving chip. The FPCB is electrically connected to the pad part of the third area PA3 and the PCB 650. The driving chip is mounted on the flexible printed circuit board and outputs a data signal to the data line DL. The PCB includes a circuit element generating a main driving signal to drive the display panel 100.

Figure 2:
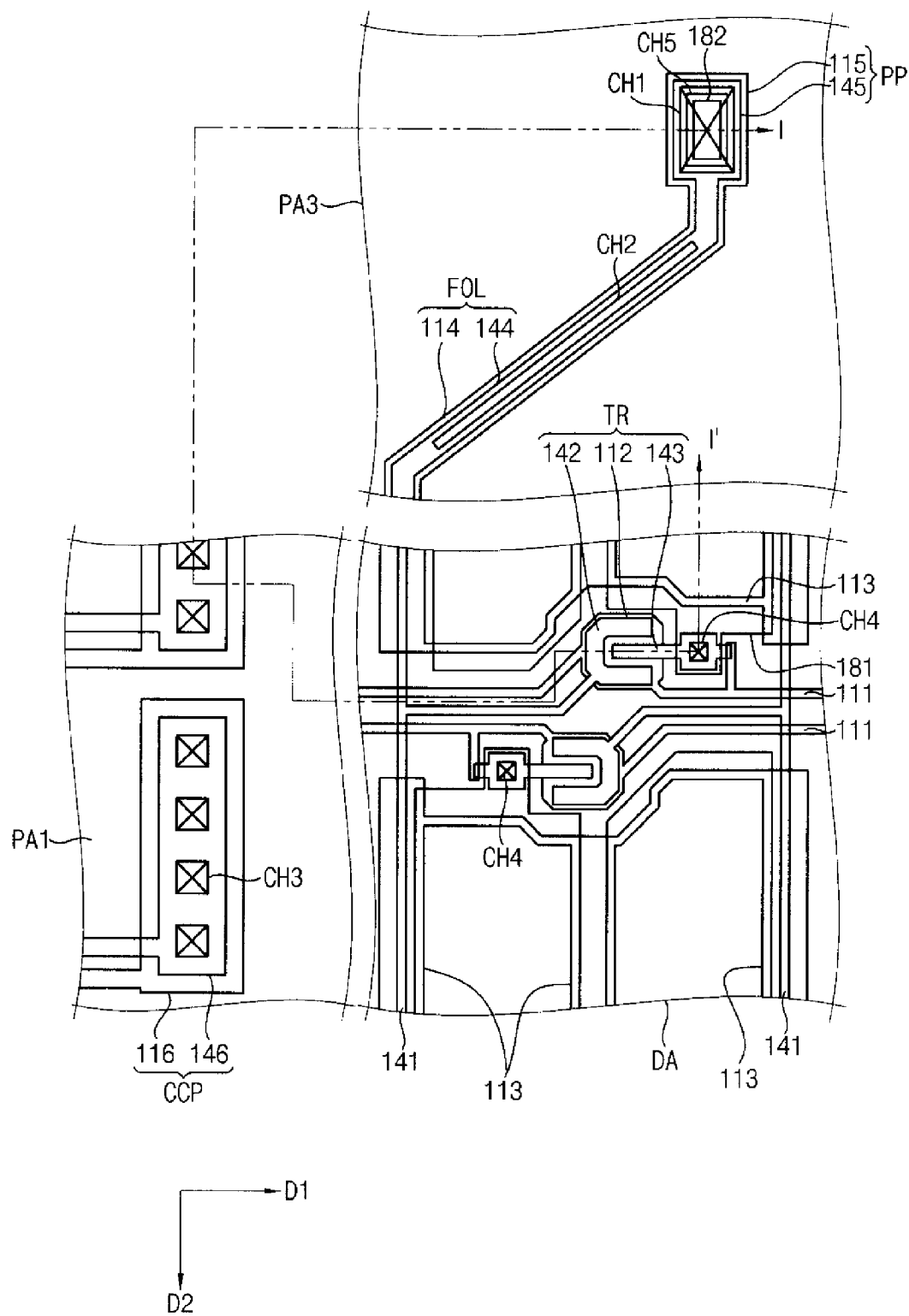
FIG. 2 is a plan view illustrating an exemplary embodiment of a display substrate of FIG. 1.
Figure 3:
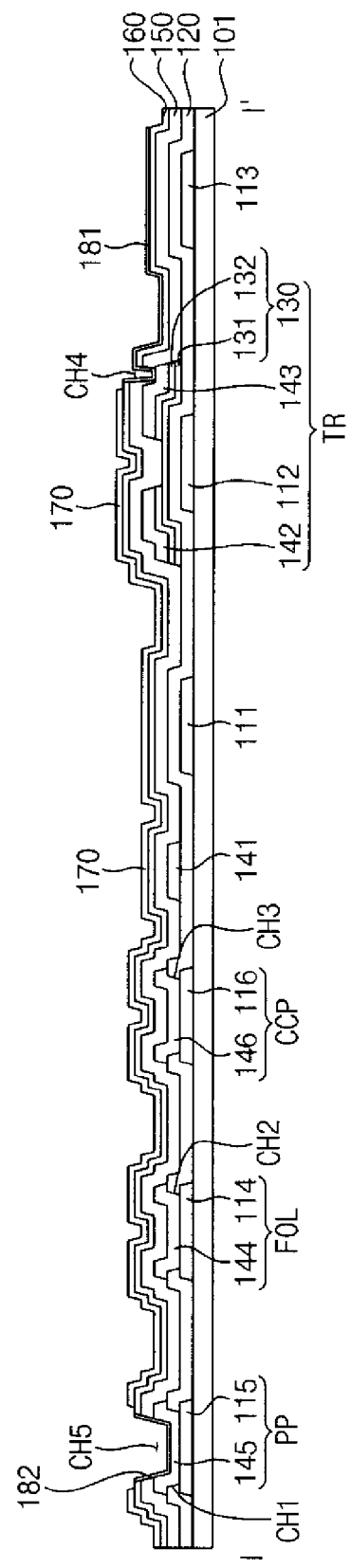
FIG. 3 is a cross-sectional view taken along line I-I' in FIG. 2.

FIG. 2 is a plan view illustrating an exemplary embodiment of a display substrate of FIG. 1. FIG. 3 is a cross-sectional view taken along line I-I' in FIG. 2.

Referring to FIGS. 2 and 3, the display substrate 100 includes a base substrate 101, a first conduction pattern 111, 112, 113, 114, 115 and 116, a gate insulating layer 120, an active pattern 130, a second conduction pattern 141, 142, 143, 144, 145 and 146, a protecting layer 150, a blocking layer 160, a sacrificing layer 170 and a third conduction pattern 181 and 182.

The first conduction pattern 111, 112, 113, 114, 115 and 116 includes a gate line 111, a gate electrode 112 of the switching element TR, a storage line 113, a first conductive line 114, a first pad electrode 115 and a first connection electrode 116.

The gate line 111 is disposed in the display area DA and is extended along a first direction D1. The gate electrode 112 extends from and is connected to the gate line 111. The storage line 113 includes a first part substantially parallel to the gate line and a second part extended along a second direction D2 crossing the first direction D1. The first conductive line 114 is disposed in the third area PA3 and is included in the fan-out lines FOL electrically connected to an end of a data line 141. The first pad electrode 115 is disposed in the third area PA3 and is connected to the first conductive line 114. The first connection electrode 116 is disposed in the first and second areas PA1 and PA2 and is connected to a gate electrode of the switching element for the circuit included in the gate driving circuit GDC.

The gate insulating layer 120 is disposed on the base substrate 101 on which the first conduction pattern 111, 112, 113, 114, 115 and 116 is disposed. A first contact hole CH1, a second contact hole CH2 and a third contact hole CH3 are extended through a thickness of the gate insulating layer 120. The first pad electrode 115 is exposed through the first contact hole CH1, the first conductive line 114 is exposed through the second contact hole CH2 and the first connection electrode 116 is exposed through the third contact hole CH3. The second contact hole CH2 may be a trench extended in a longitudinal direction of the the first conductive line 114 of the fan-out lines FOL.

The active pattern 130 includes a semiconductor layer 131 and an ohmic contacting layer 132. The active pattern 130 is disposed on the gate electrode 112.

The second conduction pattern 141, 142, 143, 144, 145 and 146 includes the data line 141, a source electrode 142 of the switching element TR, a drain electrode 143 of the switching element TR, a second conductive line 144, a second pad electrode 145 and a second connection electrode 146.

The data line 141 is disposed in the display area DA and is extended in the second direction D2. The source electrode 142 is extended from and connected to the data line 141 and partially overlaps with the active pattern 130. The drain electrode 143 is spaced apart from the source electrode 142 and partially overlaps with the active pattern 130.

The second conductive line 144 overlaps with the first conductive line 114 and directly makes contact with the first conductive line 114 through the second contact hole CH2. The fan-out lines FOL have a multi-layered structure in which the first conductive line 114 overlaps with the second conductive lines 144 to obtain a relatively large thickness. The first pad electrode 145 overlaps with the first pad electrode 115 and directly makes contact with the first pad electrode 115 through the first contact hole CH1.

The second connection electrode 146 overlaps with the first connection electrode 116 and directly makes contact with the first connection electrode 116 through the third contact hole CH3. The second connection electrode 146 is connected to the source or drain electrode of the switching element for the circuit included in the gate driving circuit GDC. The switching elements for the circuit in the gate driving circuit GDC are connected to each other by a circuit contact part CCP including the first and second connection electrodes 116 and 146 directly making contact with each other through the third contact hole CH3.

The fan-out lines FOL have the multi-layered structure in which the first conductive line 114 overlaps with the second conductive line 144 to obtain a relatively large thickness. The contact area of the gate driving circuit GDC may be decreased by the circuit contact part CCP so that the first and second areas PA1 and PA2 including the gate driving circuit GDC, may be decreased.

The protecting layer 150 is disposed on the base substrate 101 and on the second conduction pattern 141, 142, 143, 144, 145 and 146.

The blocking layer 160 is disposed on the base substrate 101 and on the protecting layer 150.

The sacrificing layer 170 is disposed on the base substrate 101 and on the blocking layer 160, and partially overlaps with the blocking layer 160.

A fourth contact hole CH4 and a fifth contact hole CH5 are extended through a thickness of protecting layer 150, the blocking layer 160 and the sacrificing layer 170. The drain electrode 143 is exposed through the fourth contact hole CH4 and the second pad electrode 145 is exposed through the fifth contact hole CH5.

The third conduction pattern 181 and 182 includes a pixel electrode 181 and a third pad electrode 182. The pixel electrode 181 is contacted with the drain electrode 143 through the fourth contact hole CH4 and the third pad electrode 182 is contacted with the second pad electrode 145 through the fifth contact hole CH5. A pad part PP disposed at a distal end of the fan-out lines FOL may include the first, second and third pad electrodes 115, 145 and 182.

Figure 4A:
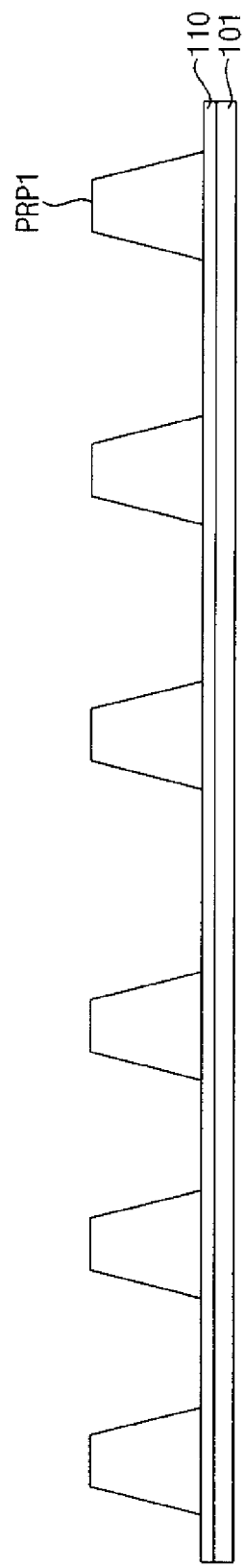
FIGS. 4A to 4N are cross-sectional views illustrating an exemplary embodiment of a method of manufacturing the display substrate of FIG. 3.
Figure 4B:
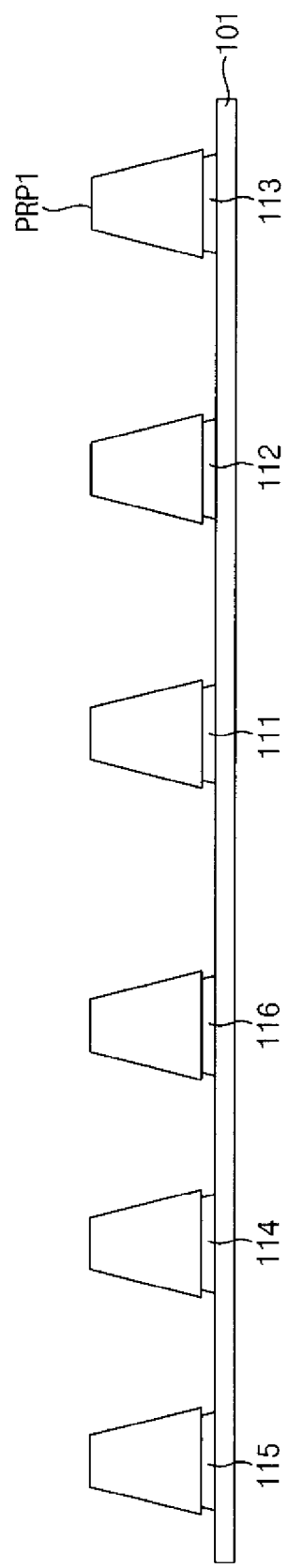
Figure 4C:
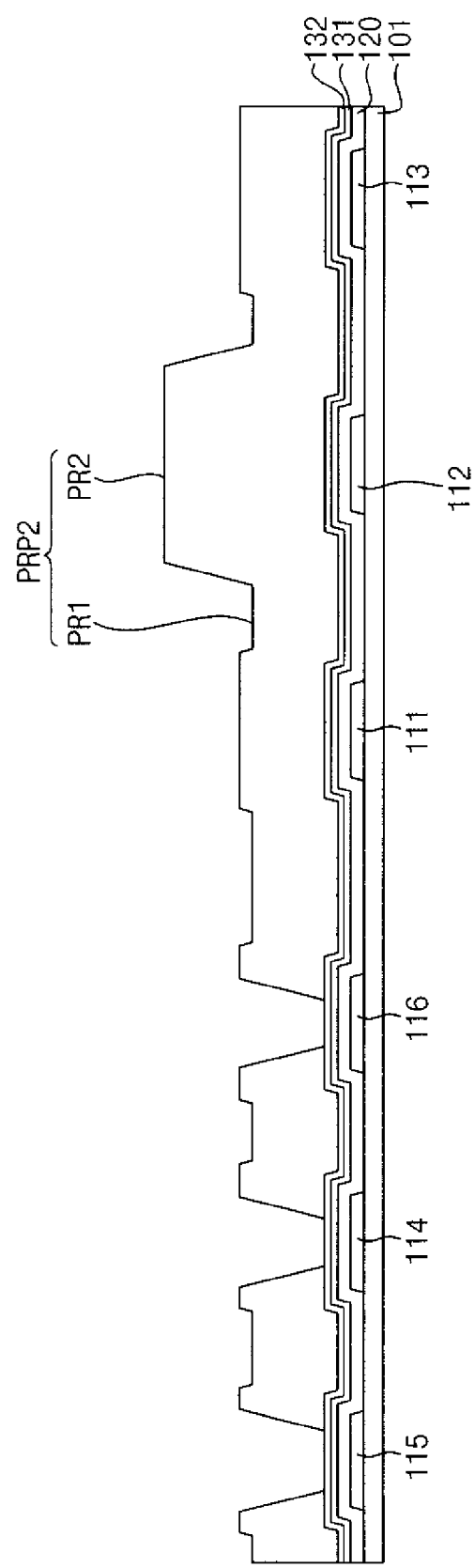
Figure 4D:
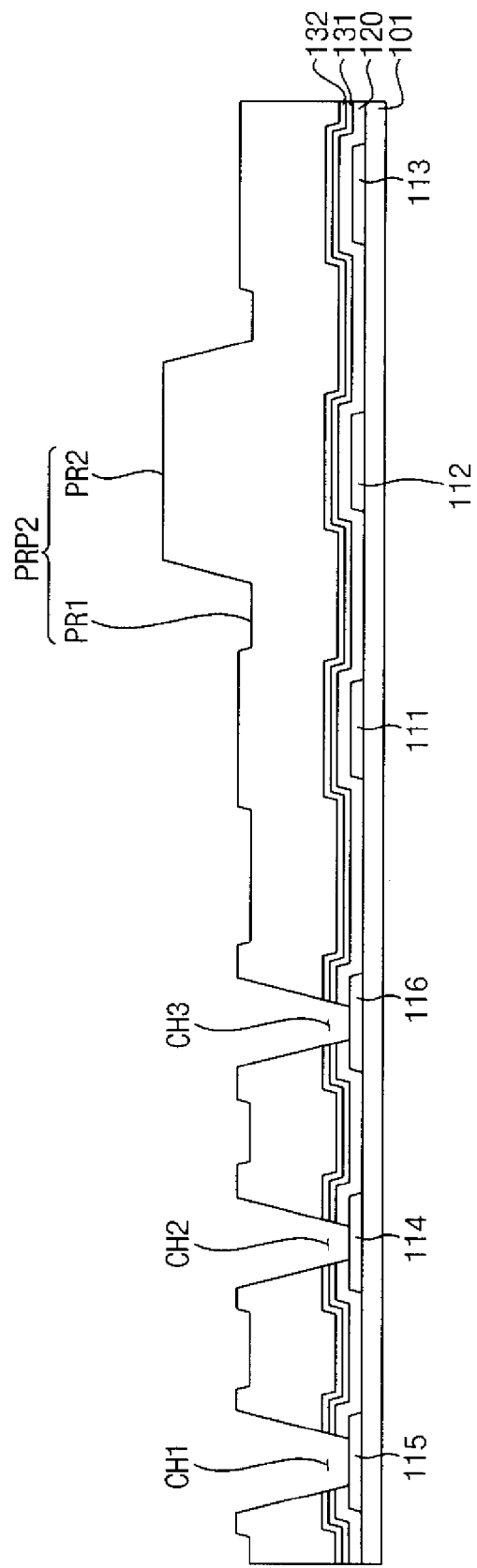
Figure 4E:
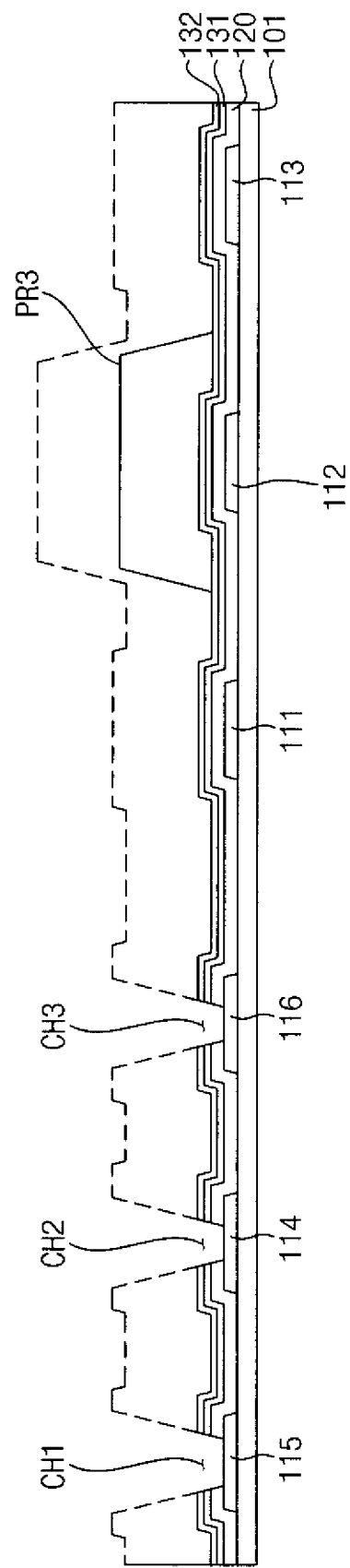
Figure 4F:
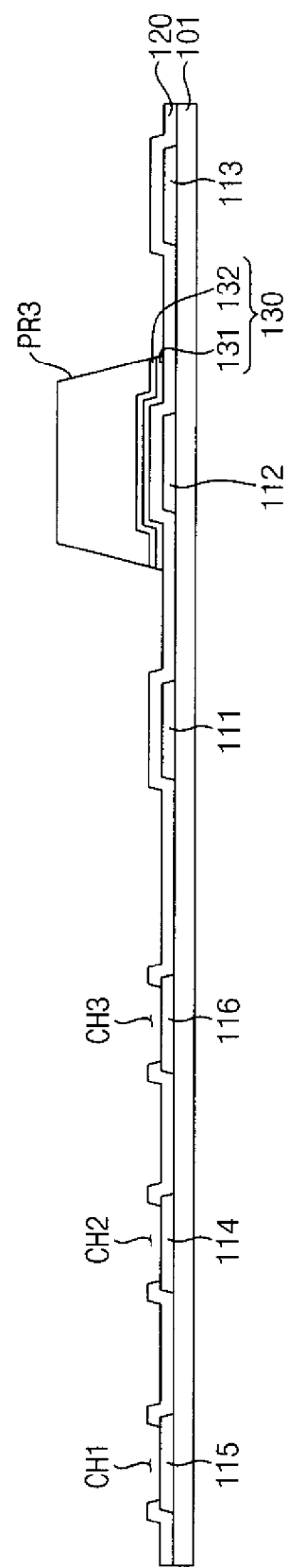
Figure 4G:
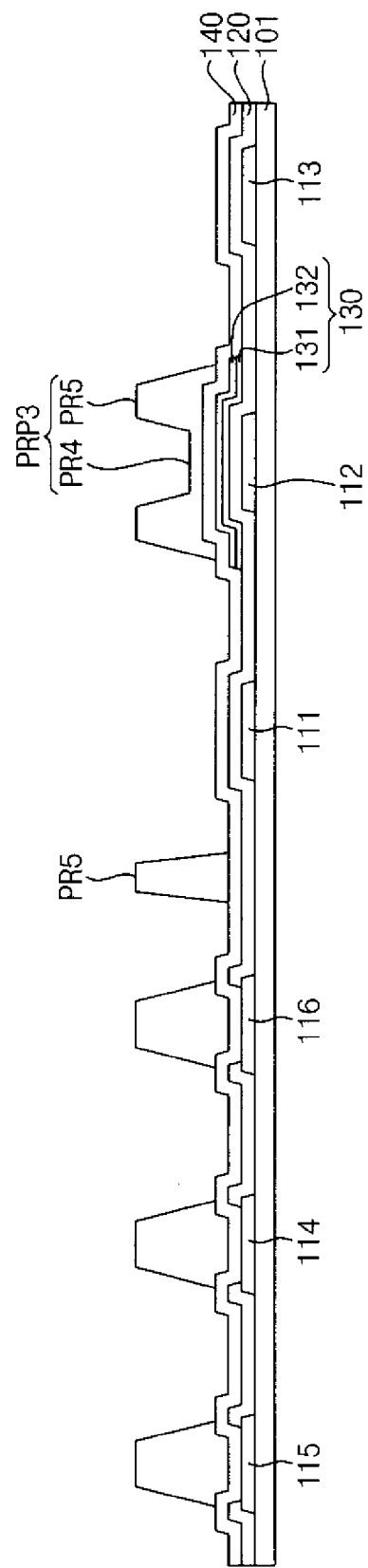
Figure 4H:
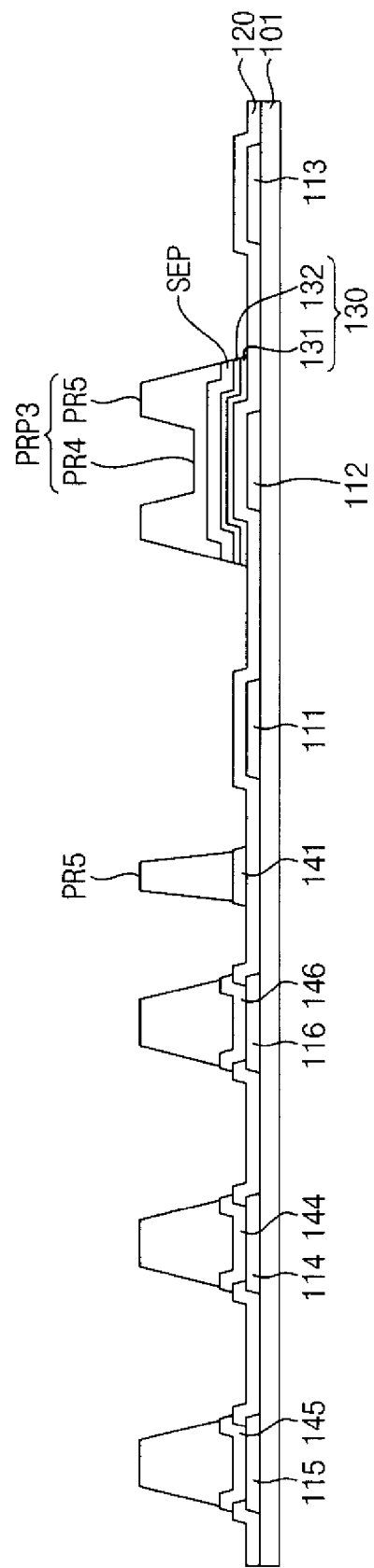
Figure 4I:
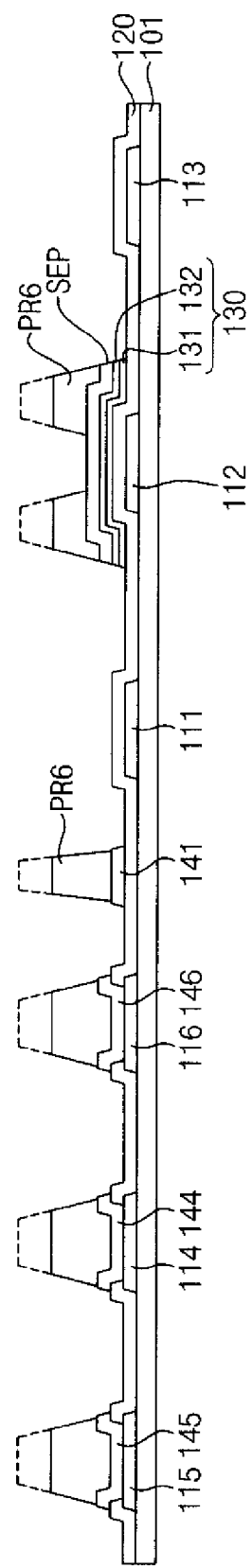
Figure 4J:
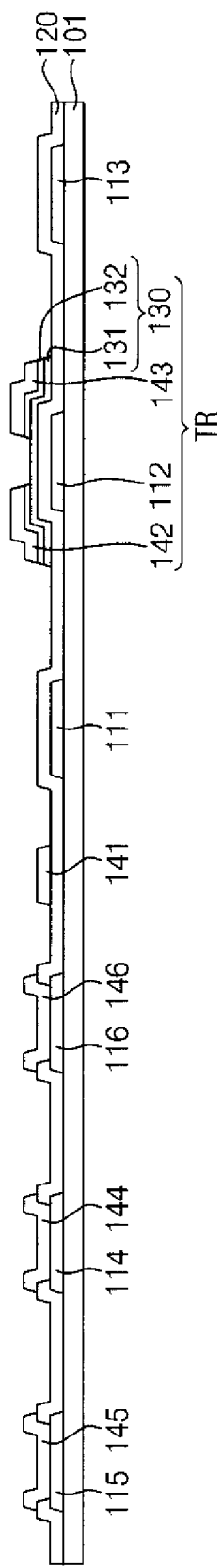
Figure 4K:
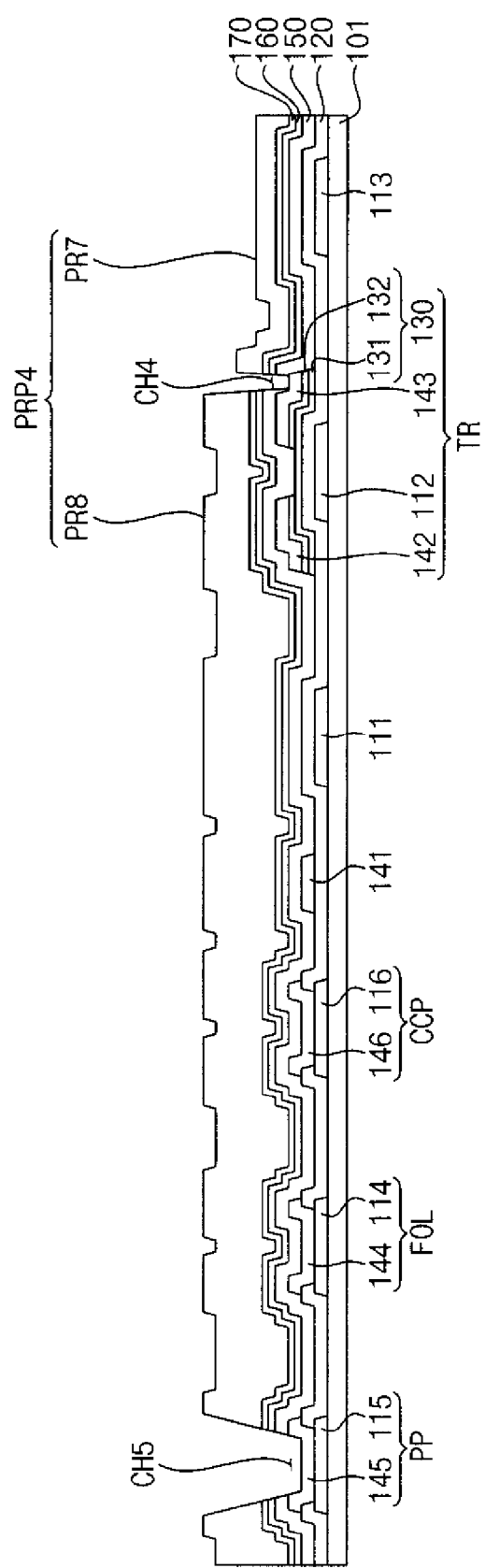
Figure 4M:
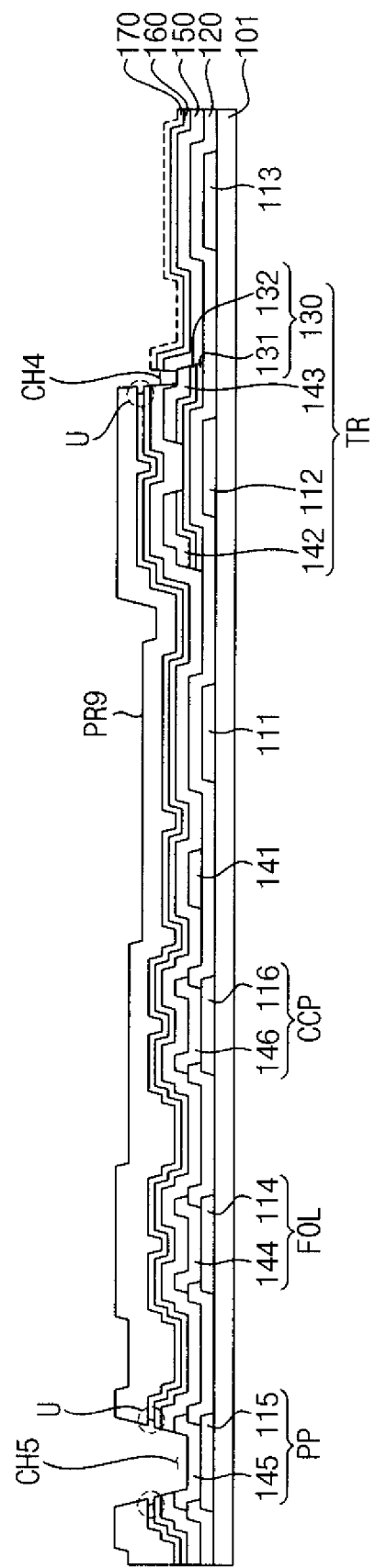
Figure 4N:
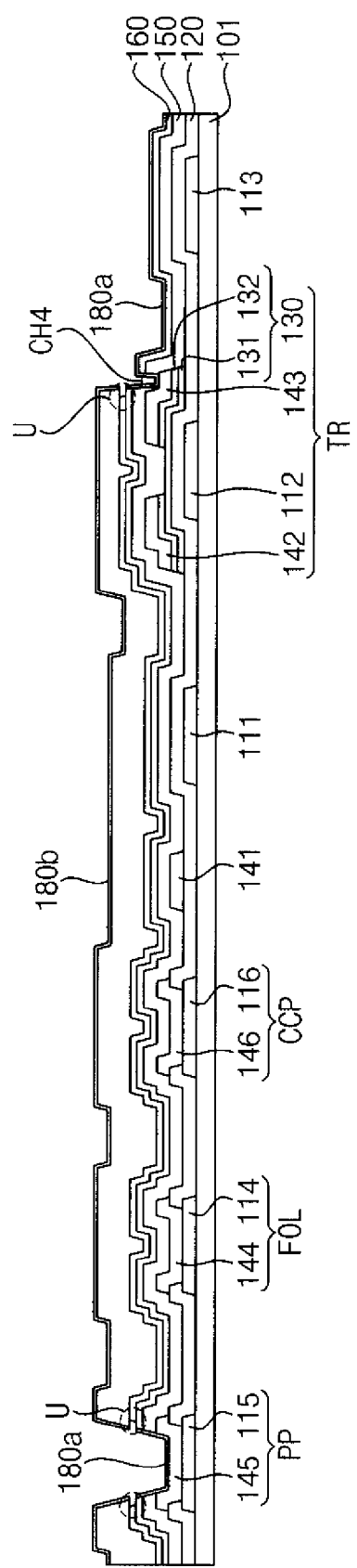

FIGS. 4A to 4N are cross-sectional views illustrating an exemplary embodiment of a method of manufacturing the display substrate of FIG. 3. FIGS. 5A to 5D are plan views illustrating the method of manufacturing the display substrate of FIG. 3.

Figure 5A:
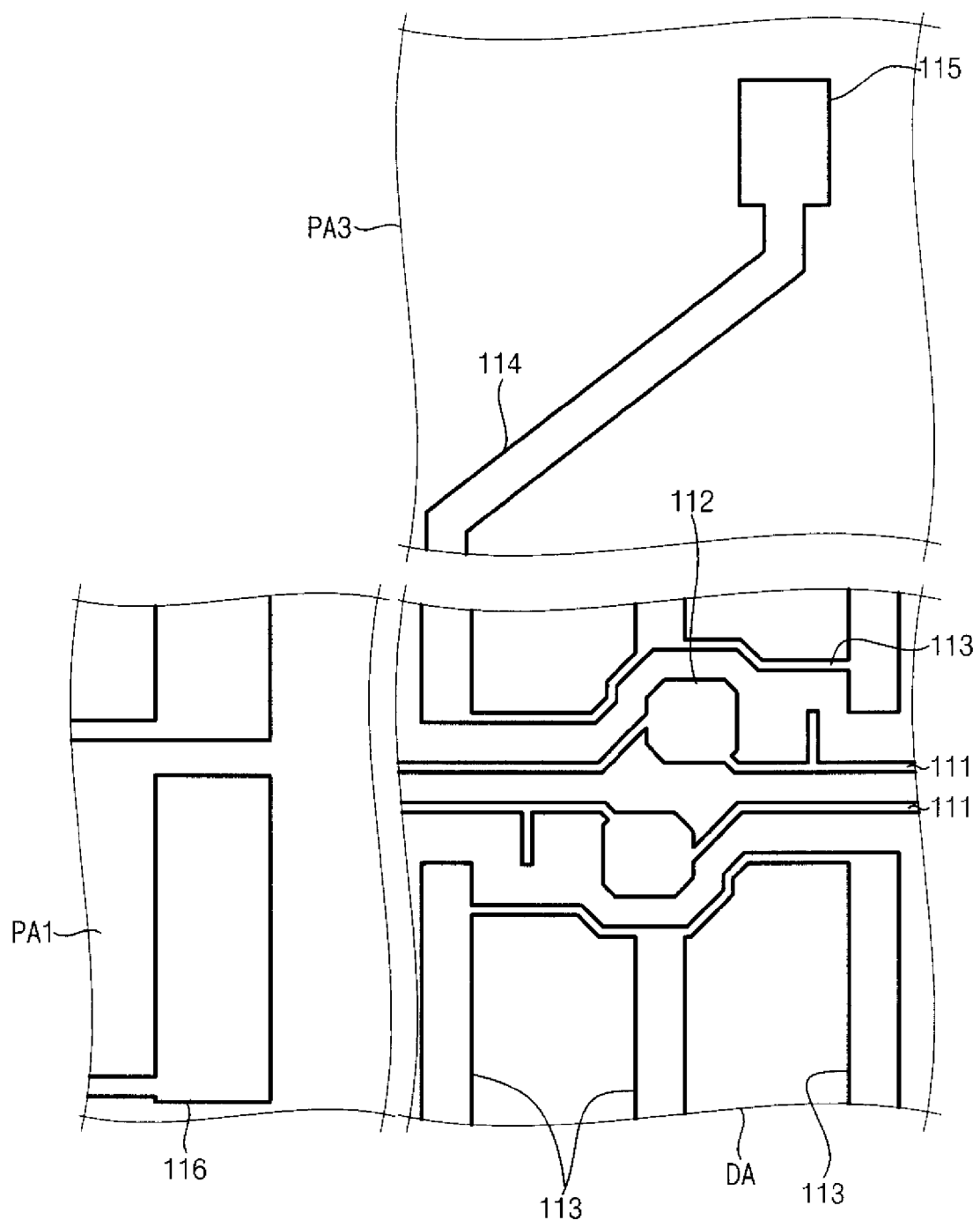
FIGS. 5A to 5D are plan views illustrating the method of manufacturing the display substrate of FIG. 3.

Referring to FIGS. 4A, 4B and 5A, a first conductive layer 110 is formed on the base substrate 101. The first conductive layer 110 includes metal such as chromium (Cr), aluminum (Al), tantalum (Ta), molybdenum (Mo), titanium (Ti), tungsten (W), copper (Cu), silver (Ag), etc or alloy thereof The first conductive layer 110 may include two or more layers having physical characteristics different from each other. In one exemplary embodiment, for example, the first conductive layer may have a multi-layered structure including aluminum (Al) and molybdenum (Mo).

A first photo resist pattern PRP1 is formed on the base substrate 101 on which the first conductive layer 110 is formed. The first conductive layer 110 is patterned into the first conduction pattern 111, 112, 113, 114, 115 and 116 using the first photo resist pattern PRP1.

The first conduction pattern 111, 112, 113, 114, 115 and 116 includes the gate line 111, the gate electrode 112, the storage line 113, the first conductive line 114, the first pad electrode 115 and the first connection electrode 116.

Figure 5B:
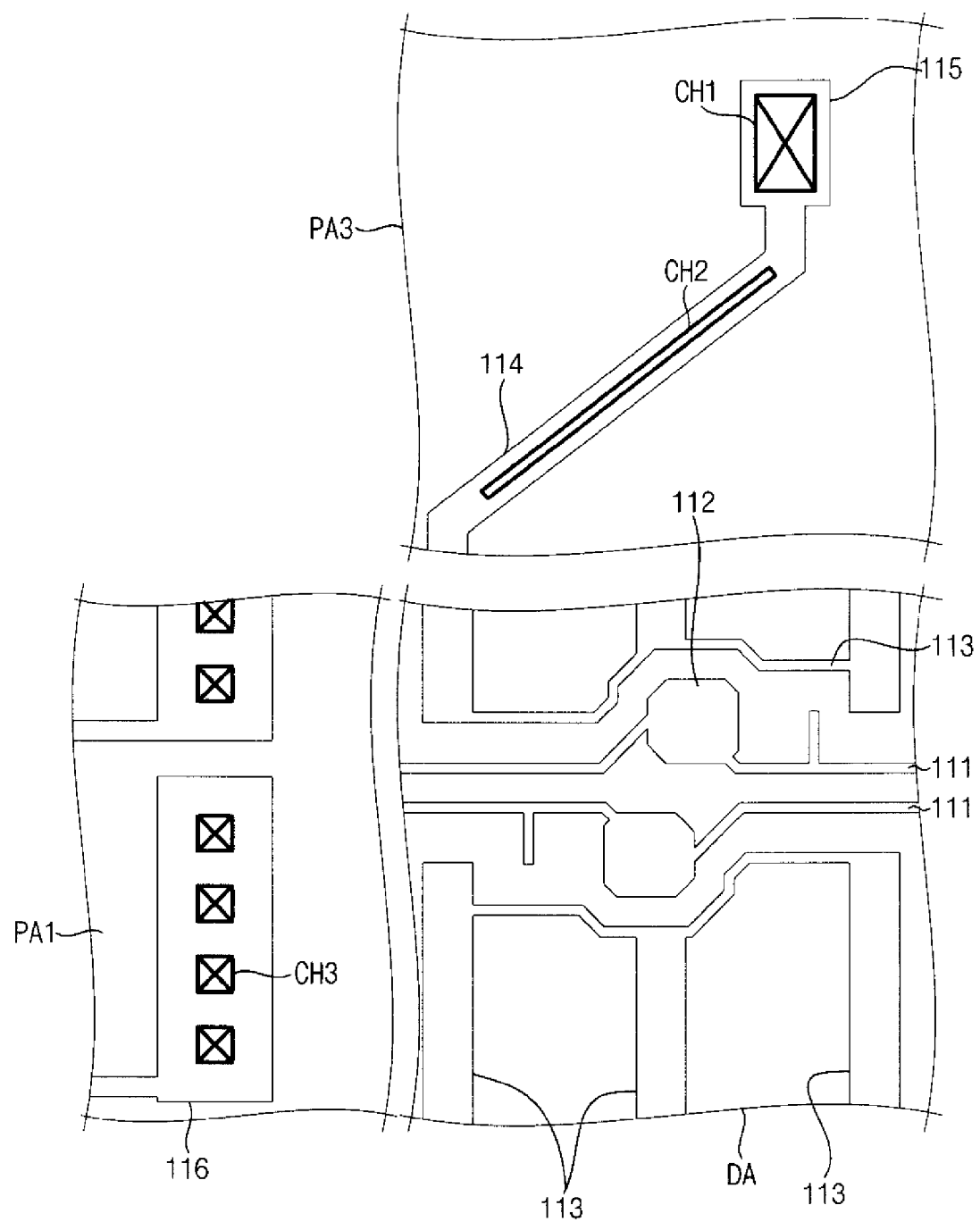

Referring to FIGS. 4C, 4D and 5B, the gate insulating layer 120 is formed on the base substrate 101 on which the first conduction pattern 111, 112, 113, 114, 115 and 116 is formed. The gate insulating layer 120 may include silicon nitride (SiNx) and silicon oxide (SiOx) such as a single-layered structure or may include two or more layers having physical characteristics and processes different from each other.

The semiconductor layer 131 and the ohmic contact layer 132 are formed on the base substrate 101 on which the gate insulating layer 120 is formed. The semiconductor layer 131 may include amorphous silicon (a-Si) and the ohmic contact layer 132 may include n+ amorphous silicon (n+a-Si).

A second photo resist pattern PRP2 is formed on the base substrate 101 on which the ohmic contact layer 132 is formed. The second photo resist pattern PRP2 is patterned using a slit or half-tone mask. The second photo resist pattern PRP2 includes a first photo pattern PR1 having a first thickness and a second photo pattern PR2 having a second thickness larger than the first thickness. The second photo pattern PR2 is disposed on the gate electrode 112.

The ohmic contact layer 132, the semiconductor layer 131 and the gate insulating layer 120 are etched using the second photo resist pattern PRP2 to form the first contact hole CH1, the second contact hole CH2 and the third contact hole CH3. The first pad electrode 115 is exposed through the first contact hole CH1, the first connection electrode 116 is exposed through the third contact hole CH3 and the first conductive line 114 is exposed through the second contact hole CH2.

Referring to FIGS. 4E, 4F and 5B, after the first, second and third contact holes CH1, CH2 and CH3 are formed, an etch-back process is performed. By the etch-back process, the first photo pattern PR1 is removed and the thickness of the second photo pattern PR2 is decreased as indicated by the dotted lines, so that the second photo pattern PRP2 is formed into a third photo pattern PR3 on the gate electrode 112.

The active pattern 130 is formed on the gate electrode 112 using the third photo pattern PR3.

Referring to 4G, 4H and 5C, a second conductive layer 140 is formed on the base substrate 101 on which the active pattern 130 is formed. The second conductive layer 140 includes metal such as chromium (Cr), aluminum (Al), tantalum (Ta), molybdenum (Mo), titanium (Ti), tungsten (W), copper (Cu), silver (Ag), etc or alloy thereof. In one exemplary embodiment, for example, the gate metal layer is formed by sputtering process. In addition, second conductive layer 140 may include two or more layers having physical characteristics different from each other.

A third photo resist pattern PRP3 is formed on the base substrate 101 on which the second conductive layer 140 is formed. The third photo resist pattern PRP3 may be patterned using the slit or half-tone mask. The third photo resist pattern PRP3 includes a fourth photo pattern PR4 having a first thickness and a fifth photo pattern PR5 having a second thickness larger than the first thickness of the fourth photo pattern PR4.

The second conductive layer 140 is patterned into the second conduction pattern 141, SEP, 144, 145 and 146 using the fourth and fifth photo patterns PR4 and PR5. The second conduction pattern 141, SEP, 144, 145, 146 includes the data line 141, a switch electrode pattern SEP, the second conductive line 144, the first pad electrode 145 and the second connection electrode 146. The switch electrode pattern SEP includes the source electrode 142 and the drain electrode 143.

Figure 5C:
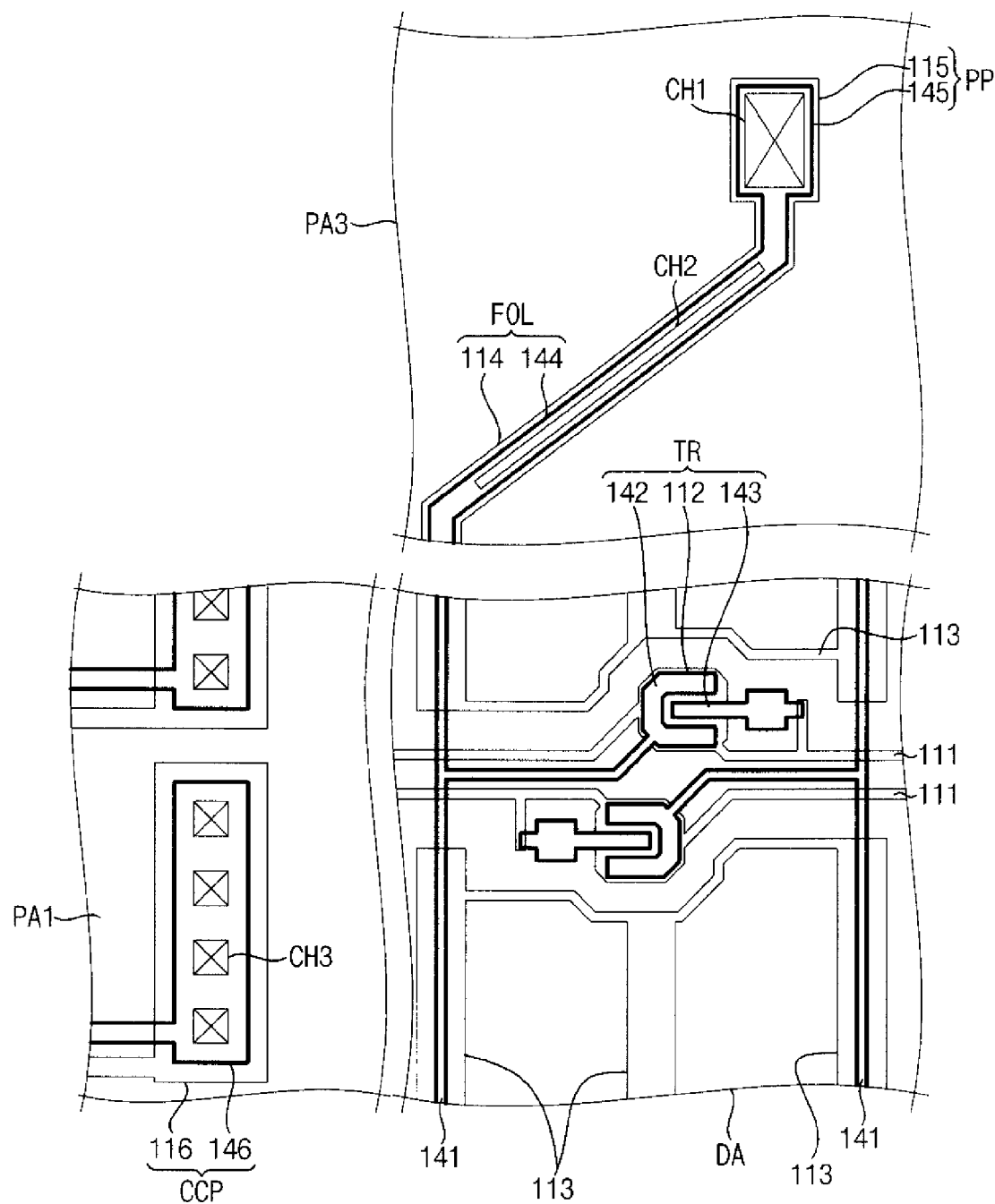

Referring to FIGS. 4I, 4J and 5C, after the second conduction pattern 141, SEP, 144, 145 and 146 are formed, the etch-back process is performed. By the etch-back process, the fourth photo pattern PR4 is removed as indicated by the dotted lines, to partially expose the switch electrode pattern SEP. The fifth photo pattern PR5 is partially removed as indicated by the dotted lines, to be formed into a sixth photo pattern PR6 on the second conduction pattern 141, SEP, 144, 145 and 146.

The switch electrode pattern SEP is patterned into the source electrode 142 and the drain electrode 143 using the sixth photo pattern PR6. Then, the ohmic contact layer 132 is removed using the source electrode 142 and the drain electrode 143 as a mask to form a channel of the switching element TR.

Figure 5D:
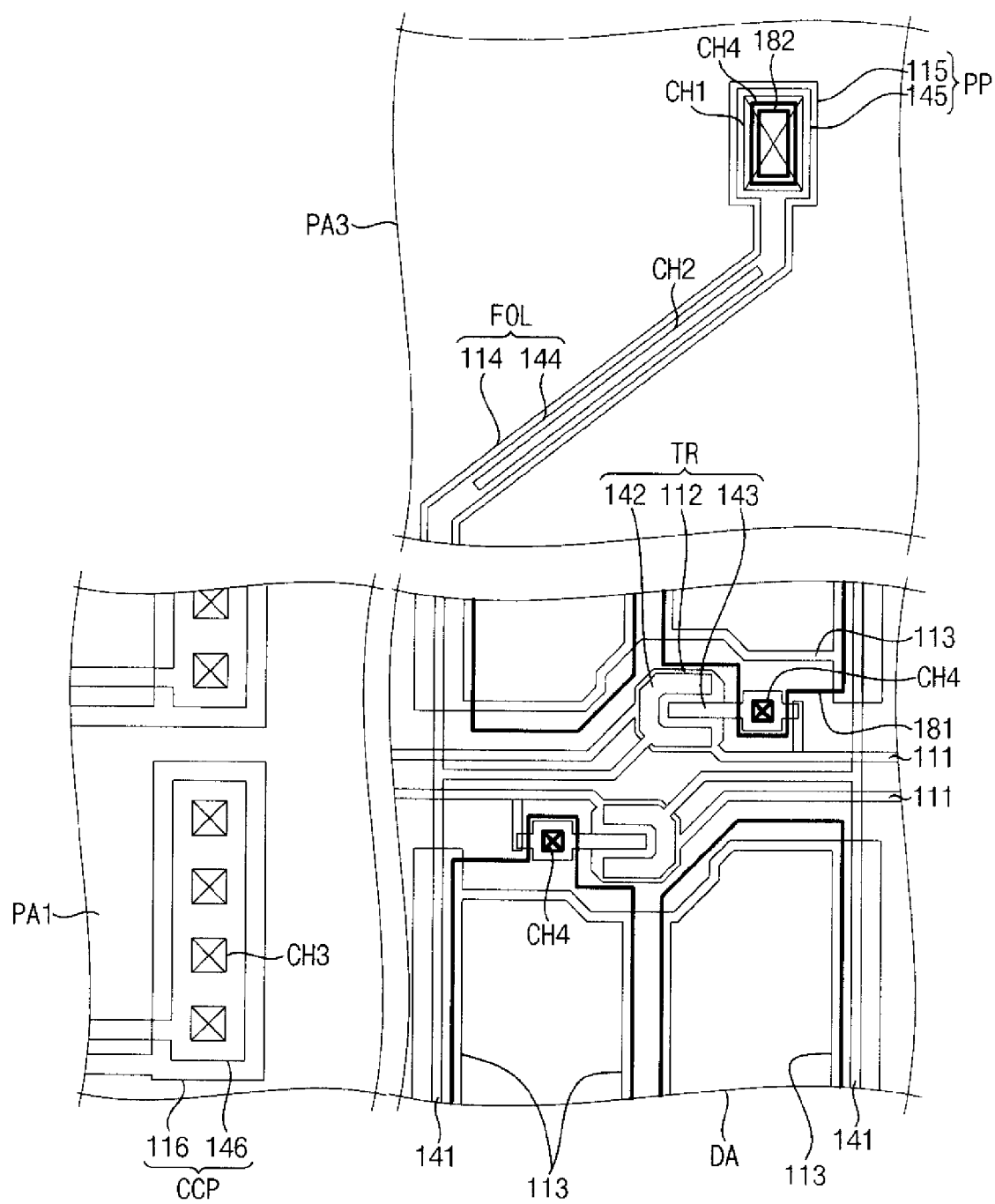

Referring to FIGS. 4K, 4L and 5D, the protecting layer 150, the blocking layer 160 and a sacrificing layer 170 are sequentially formed on the base substrate 101 on which the switching element TR is formed.

The protecting layer 150, the blocking layer 160 and the sacrificing layer 170 may include silicon nitride (SiNx) and are respectively formed by different processes. The protecting layer 150 may include a high density of nitride (Nx) of those. The sacrificing layer 170 is sacrificed to form an under cut used in a lift-off process. The blocking layer 160 blocks the protecting layer 150 to be etched in a process forming the under cut.

A fourth photo resist pattern PRP4 is formed on the base substrate 101 on which the sacrificing layer 170 is formed. The fourth photo resist pattern PRP4 is patterned using the slit or half-tone mask. The fourth photo resist pattern PRP4 includes a seventh photo pattern PR7 having a first thickness and an eighth photo pattern PR8 having a second thickness thicker than the first thickness of the seventh photo pattern PR7. The seventh photo pattern PR7 is disposed in an area in which the pixel electrode 181 is formed.

The protecting layer 150, the blocking layer 160 and the sacrificing layer 170 are etched using the seventh and eighth photo patterns PR7 and PR8 to form a fourth contact hole CH4 and a fifth contact hole CH5. The drain electrode 143 is exposed through the fourth contact hole CH4 and the second pad electrode 145 is exposed through the fifth contact hole CH5.

After the fourth and fifth contact holes CH4 and CH5 are formed, the etch-back process is performed. By the etch-back process, the seventh photo pattern PR7 is removed and the eighth photo pattern PR8 is partially removed, as indicated by the dotted lines, to form a ninth photo pattern PR9.

Referring to FIGS. 4M, 4N and 5D, the sacrificing layer 170 is etched using the ninth photo pattern PR9. In the illustrated exemplary embodiment, for example, by an isotropic etching process, the sacrificing layer 170 exposed through the ninth photo pattern PR9 is removed as indicated by the dotted line. The sacrificing layer 170 disposed at a side of the ninth photo pattern PR9 is over-etched so that an edge of the sacrificing layer 170 sinks inside in comparison with an edge of the ninth photo pattern PR9 3 and thus, for example, the under cut U occurs.

A third conductive layer 180 is formed on the base substrate 101 on which the under cut U is formed. The third conductive layer 180 may be a transparent conductive material, for example, indium tin oxide ("ITO") or indium zinc oxide ("IZO") or amorphous indium tin oxide (a-ITO).

The third conductive layer 180 includes a first conductive electrode pattern 180b disposed on the ninth photo pattern PR9 and a second conductive electrode pattern 180a divided from the first conductive electrode pattern 180b by the under cut U.

Then, a lift-off process is performed on the base substrate 101 including the first and second conductive electrode patterns 180b and 180a formed on the base substrate 101. In the lift-off process, the ninth photo pattern PR9 and the first conductive electrode pattern 180b are removed. In one exemplary embodiment, for example, the base substrate 101 including the under cut U is soaked in a strip solution (photoresist stripper). The photoresist stripper sinks into the ninth photo pattern PR9 through the under cut U and lifts the ninth photo pattern PR9 off (e.g., the lift-off process). Therefore, the ninth photo pattern PR9 is spaced apart from the base substrate 101 and the first conductive electrode pattern 180b disposed on the ninth photo pattern PR9 is removed from the base substrate 101.

As a result, the pixel electrode 181 and the third pad electrode 182 are formed on the base substrate 101. The pixel electrode 181 is connected to the drain electrode 143 through the fourth contact hole CH4, and the third pad electrode 182 is connected to the second pad electrode 145 through the fifth contact hole CH5.

Hereinafter, the same reference numerals will be used to refer to the same or like parts as those described in the previous exemplary embodiment, and any repetitive detailed explanation will be omitted.

FIGS. 6A to 6F are cross-sectional views illustrating another exemplary embodiment of a method of manufacturing a display substrate according to the invention.

According to the another exemplary embodiment, a method of manufacturing a first conduction pattern 111, 112, 113, 114, 115, 116 is the substantially same as those of the previous exemplary embodiment described referring to FIGS. 4A, 4B and 5A.

Figure 6A:
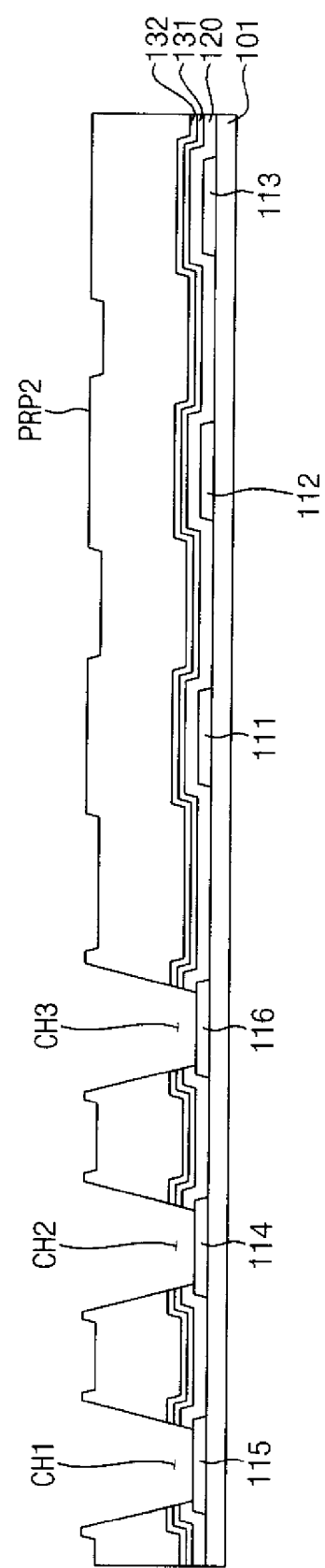
FIGS. 6A to 6F are cross-sectional views illustrating another exemplary embodiment of a method of manufacturing a display substrate according to the invention.

Referring to FIGS. 5B and 6A, the gate insulating layer 120, the semiconductor layer 131 and the ohmic contact layer 132 are sequentially formed on the base substrate 101 on which the first conduction pattern 111, 112, 113, 114, 115, 116 is formed.

The second photo resist pattern PRP2 is formed to have a substantially uniform thickness on the base substrate 101 on which the ohmic contact layer 132 is formed.

The ohmic contact layer 132, the semiconductor layer 131 and the gate insulating layer 120 are etched using the second photo resist pattern PRP2 to form the first contact hole CH1, the second contact hole CH2 and the third contact hole CH3. The first pad electrode 115 is exposed through the first contact hole CH1, the first connection electrode 116 is exposed through the third contact hole CH3 and the first conductive line 114 is exposed through the second contact hole CH2.

Figure 6B:
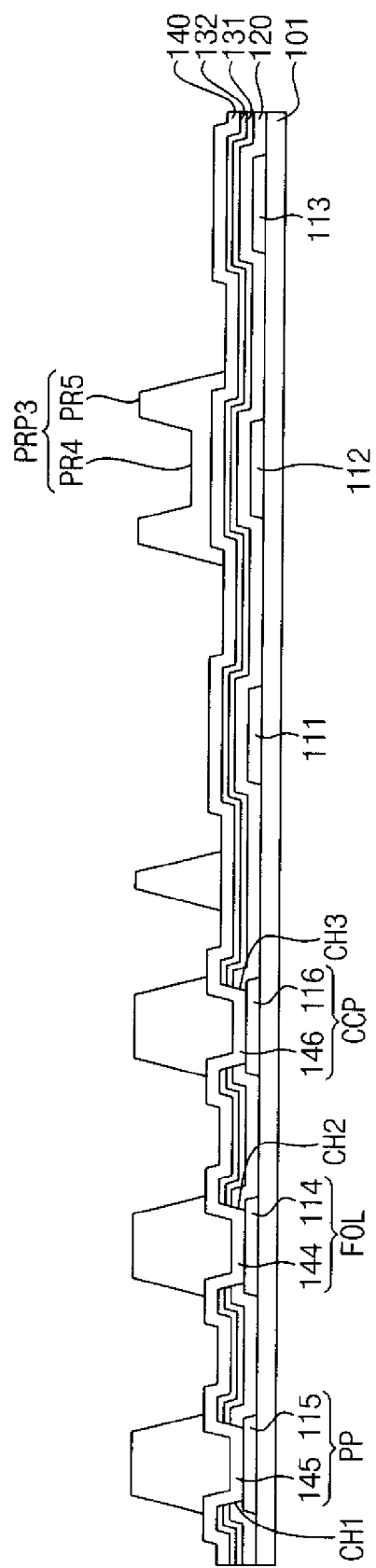

Referring to FIGS. 5C and 6B, the second conductive layer 140 is formed on the base substrate 101 on which the first contact hole CH1, the second contact hole CH2 and the third contact hole CH3 are formed. The fourth conductive layer 140 is contacted with the first pad electrode 115 through the first contact hole CH1, the first connection electrode 116 through the third contact hole CH3, and the first conductive line 114 through the second contact hole CH2 and is directly disposed on the ohmic contact layer 132.

A third photo resist pattern PRP3 is formed on the base substrate 101 on which the fourth conductive layer 140 is formed. The third photo resist pattern PRP3 is patterned using the slit or half-tone mask. The third photo resist pattern PRP3 includes a fourth photo pattern PR4 having a first thickness and a fifth photo pattern PR5 having a second thickness thicker than the first thickness of the fourth photo pattern PR4.

Figure 6C:
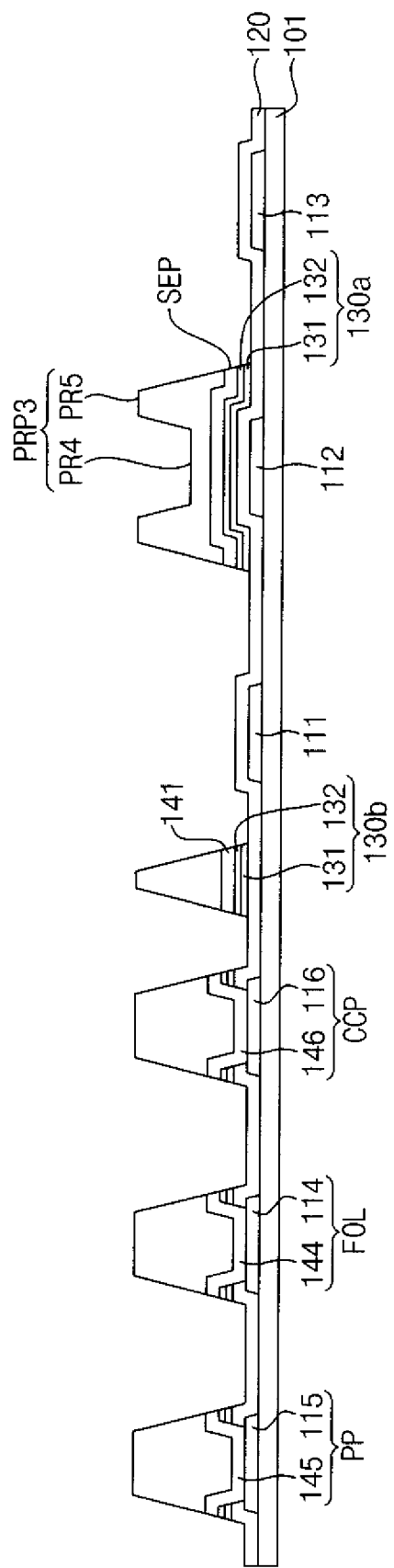

Referring to FIGS. 5C and 6C, the second conductive layer 140, the ohmic contact layer 132 and the semiconductor layer 131 are etched using the fourth and fifth photo patterns PR4 and PR5. In one exemplary embodiment, for example, the second conductive layer 140 may be etched by a wet chemical etching and the ohmic contact layer 132 and the semiconductor layer 131 may be etched by a dry chemical etching.

Therefore, a second conduction pattern 141, SEP, 144, 145 and 146 and an active pattern 130 are formed on the base substrate 101. The active pattern may include a first active pattern 130a disposed under the switching electrode pattern SEP and a second active pattern 130b disposed under the data line 141.

Figure 6D:
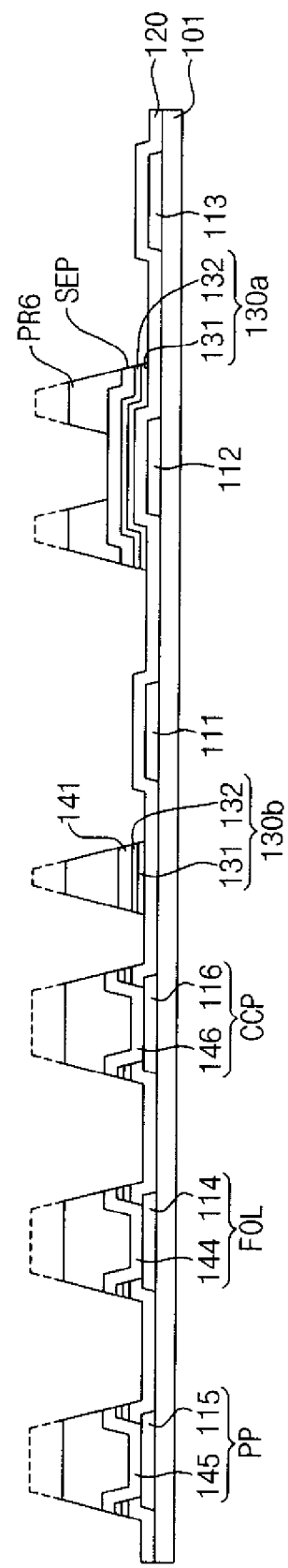
Figure 6E:
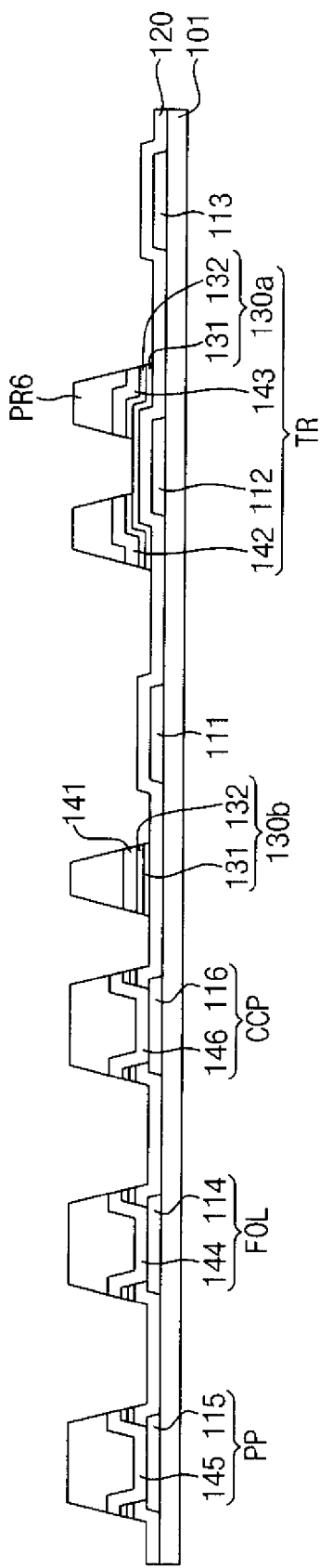

Referring to FIGS. 5C, 6D and 6E, after the second conduction pattern 141, SEP, 144, 145 and 146 and the active pattern 130a and 130b are formed on the base substrate 101, the etch-back process is performed. By the etch-back process, the fourth photo pattern PR4 is removed to partially expose the switch electrode pattern SEP. The fifth photo pattern PR5 is partially removed to form a sixth photo pattern PR6 on the second conduction pattern 141, SEP, 144, 145 and 146.

The switch electrode pattern SEP is patterned into the source electrode 142 and the drain electrode 143 using the sixth photo pattern PR6. Then, the ohmic contact layer 132 exposed between the source electrode 142 and the drain electrode 143 is removed using the source electrode 142 and the drain electrode 143 as the mask so that the channel of the switching element TR is formed.

Figure 6F:
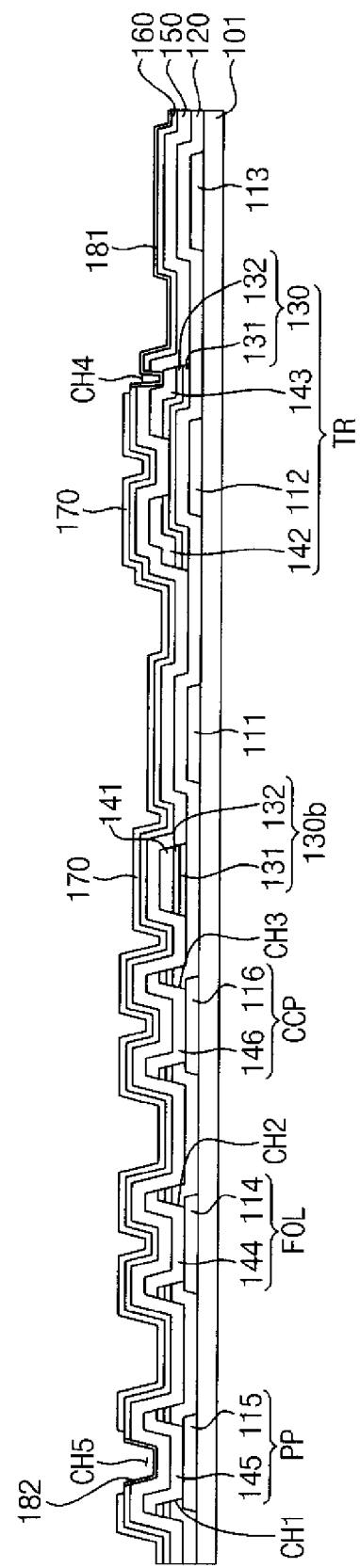

Referring to FIGS. 5D and 6F, a following process of a process of forming the switching element TR is the substantially same as those of the previous exemplary embodiment described referring to FIGS. 4K to 4N.

Therefore, the display substrate of the illustrated exemplary embodiment further includes the second active pattern 130b disposed under the second active pattern 130b in comparison with the display substrate of the previous exemplary embodiment in FIG. 3.

Figure 7A:
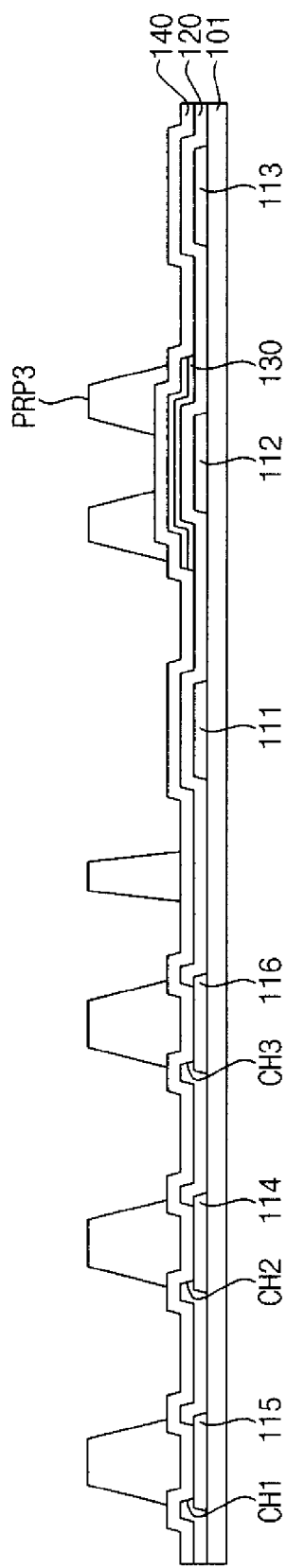
FIGS. 7A to 7B are cross-sectional views illustrating still another exemplary embodiment of a method of manufacturing a display substrate according to the invention.
Figure 7B:
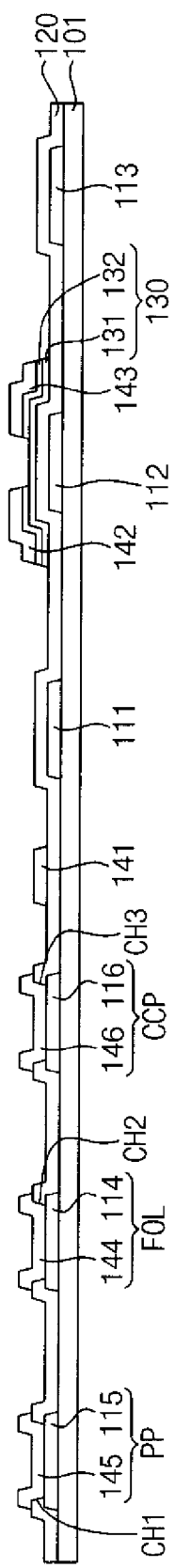

FIGS. 7A to 7B are cross-sectional views illustrating still another exemplary embodiment of a method of manufacturing a display substrate according to the invention.

According to the exemplary embodiment, methods of manufacturing a first conduction pattern 111, 112, 113, 114, 115 and 116, a first contact hole CH1, a second contact hole CH2, a third contact hole CH3 and an active pattern 130 are the substantially same as those of the previous exemplary embodiment described referring to FIGS. 4A to 4F, 5A and 5B.

Referring to FIGS. 5C and 7A, a second conductive layer 140 is formed on the base substrate 101 on which the first contact hole CH1, the second contact hole CH2, the third contact hole CH3 and the active pattern 130 are formed. The fourth conductive layer 140 is formed on the base substrate 101 on which the active pattern 130 is formed and is contacted with the first pad electrode 115 through the first contact hole CH1, the first connection electrode 116 through the third contact hole CH3 and the first conductive line 114 through the second contact hole CH2.

The third photo resist pattern PRP3 is formed to have a uniform thickness on the base substrate 101 on which the fourth conductive layer 140 is formed. Referring to FIG. 7B, the fourth conductive layer 140 is patterned into a second conduction pattern 141, 142, 143, 144, 145 and 146 using the third photo resist pattern PRP3. Then, the ohmic contact layer 132 is removed using the source electrode 142 and the drain electrode 143 as the mask to form a channel of the switching element TR such as the described in FIG. 4J.

A following process of a process forming the switching element TR is the substantially same as those of the previous exemplary embodiment described referring to FIGS. 4K to 4N and 5D.

Therefore, elements of the display substrate according to the exemplary embodiment are the substantially same as those of the display substrate of the previous exemplary embodiment in FIG. 3.

Figure 8A:
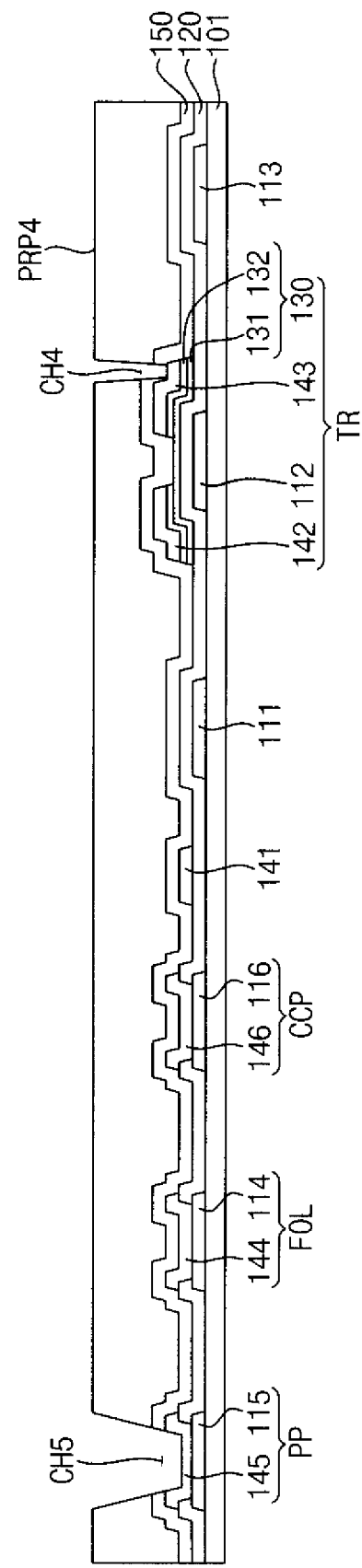
FIGS. 8A to 8C are cross-sectional views illustrating still another exemplary embodiment of a method of manufacturing a display substrate according to the invention.
Figure 8B:
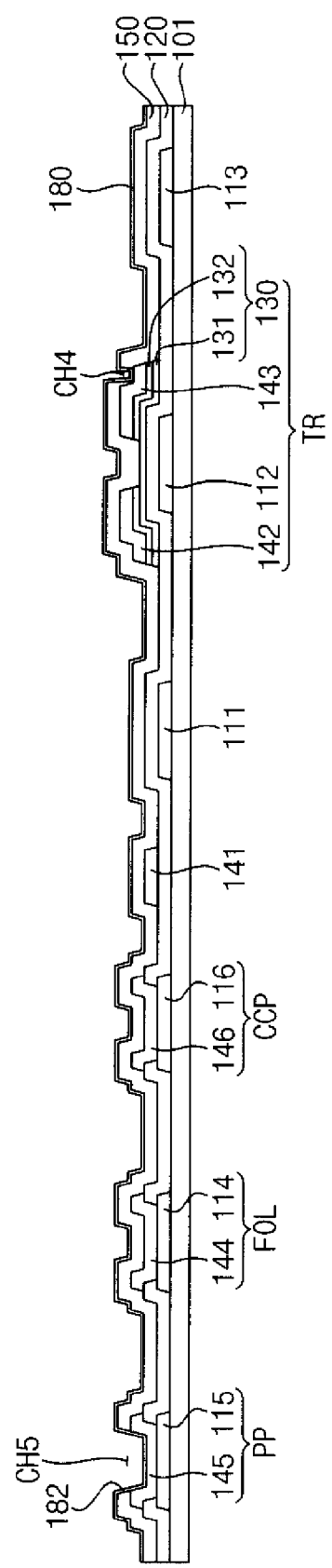
Figure 8C:
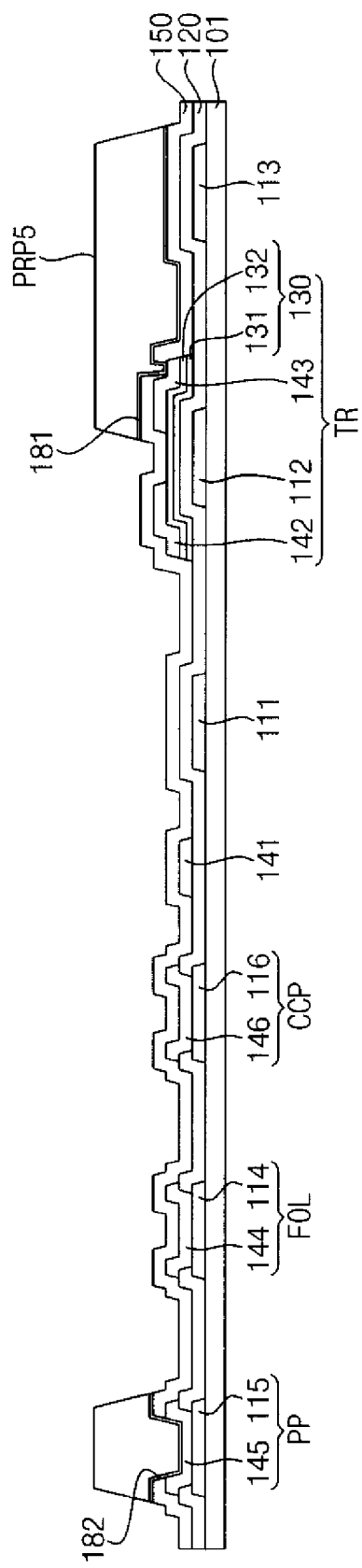

FIGS. 8A to 8C are cross-sectional views illustrating still another exemplary embodiment of a method of manufacturing a display substrate according to the invention.

According to the exemplary embodiment, methods of manufacturing a first conduction pattern 111, 112, 113, 114, 115 and 116, a first contact hole CH1, a second contact hole CH2, a third contact hole CH3, an active pattern 130 and second conduction pattern 141, 142, 143, 144, 145 and 146 are the substantially same as those of the previous exemplary embodiment described referring to FIGS. FIGS. 4A to 4J and 5A to 5C.

Referring to FIGS. 5D and 8A, the protecting layer 150 is formed on the base substrate 101 on which the second conduction pattern 141, 142, 143, 144, 145 and 146 is formed. A fourth photo resist pattern PRP4 is formed to have a uniform thickness on the base substrate 101 on which the protecting layer 150 is formed. According to the exemplary embodiment, the blocking layer 160 and the sacrificing layer 170 are omitted in comparison with the previous exemplary embodiment.

The protecting layer 150 is removed using the fourth photo resist pattern PRP4. A fourth contact hole CH4 and a fifth contact hole CH5 are formed in the protecting layer 150. The drain electrode 143 is exposed through the fourth contact hole CH4 and the second pad electrode 145 is exposed through the fifth contact hole CH5.

Referring to FIGS. 5D and 8B, a third conductive layer 180 is formed on the base substrate 101 on which the third and fourth contact holes CH3 and CH4 are formed. The third conductive layer 180 is contacted with the drain electrode 143 through the fourth contact hole CH4, contacted with the second pad electrode 145 through the fifth contact hole CH5 and formed on the base substrate 101.

Referring to FIGS. 5D and 8C, a fifth photo resist pattern PRP5 is formed to have a uniform thickness on the base substrate 101 on which the third conductive layer 180 is formed. The third conductive layer 180 is patterned into a pixel electrode 181 and a third pad electrode 182 using the fifth photo resist pattern PRP5.

The pixel electrode 181 is contacted with the drain electrode 143 through the fourth contact hole CH4, and the third pad electrode 182 is contacted with the second pad electrode 145 through the fifth contact hole CH5.

According to the exemplary embodiment, the protecting layer 150 and the third conductive layer 180 are respectively patterned using the fourth and fifth photo resist patterns and are different from those of the previous exemplary embodiment. In the display substrate according the exemplary embodiment, the blocking layer 160 and the sacrificing layer 170 included in the previous exemplary embodiment of FIG. 3 are omitted. Therefore, the display substrate of the exemplary embodiment is the substantially same as that of the previous exemplary embodiment except for the blocking layer 160 and the sacrificing layer 170.

As described above, the pad part PP may include the first pad electrode 115 which is the first conduction pattern, the second pad electrode 145 which is second conduction pattern and the third pad electrode 182 which is third conduction pattern, but the first pad electrode 115 may be omitted from the pad part PP and the pad part PP may merely include the second pad electrode 145 and the third pad electrode 182. In addition, the gate driving circuit GDC is formed in the first and second areas PA1 and PA2, but a gate pad part including a plurality of gate pads connected to the gate lines may be formed in the first and second areas PA1 and PA2. In this case, the gate pad part may be formed with the same as the pad part PP. Alternatively, as discussed above, the gate pad part may not include the second pad electrode 145 and may include the first pad electrode 115 and the third pad electrode 182.

Figure 9:
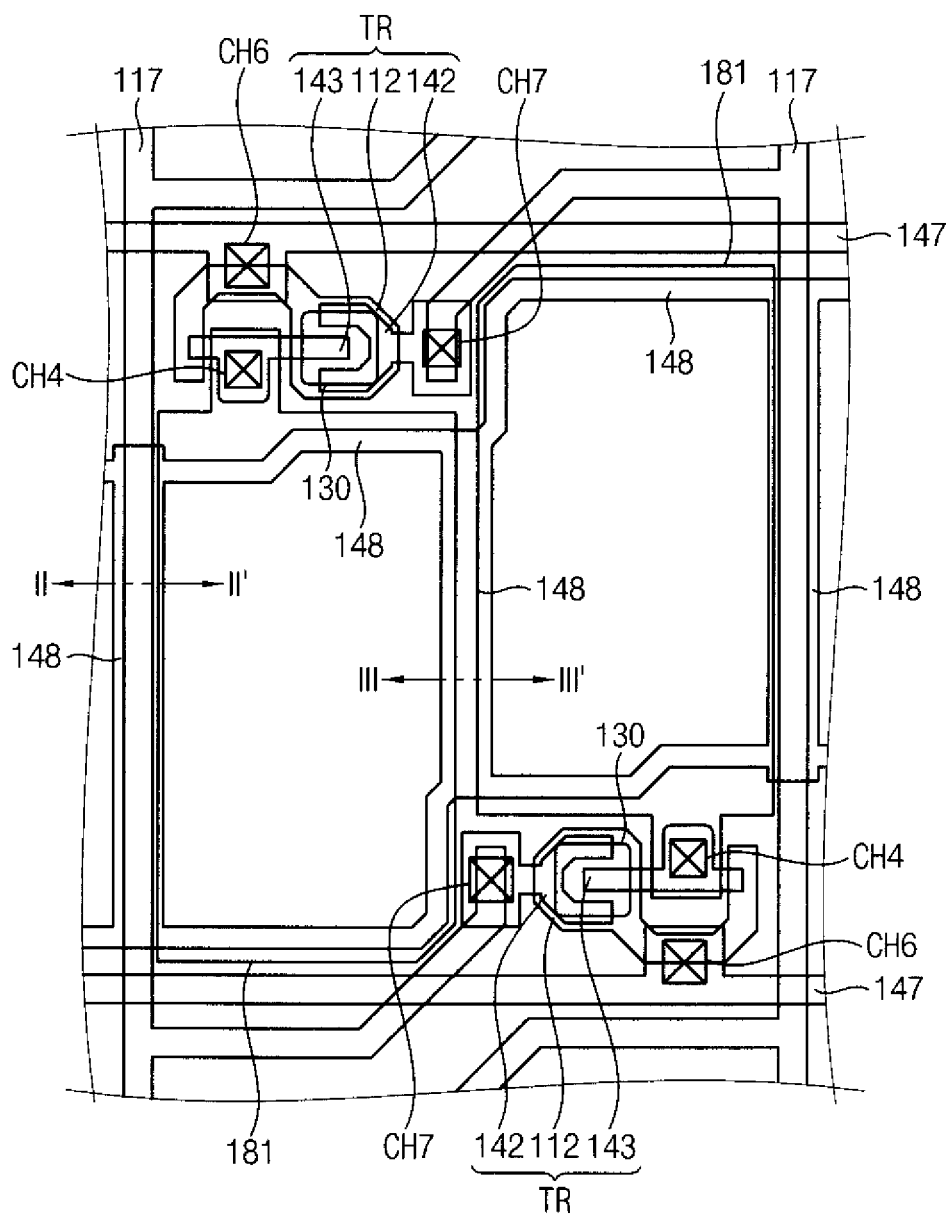
FIG. 9 is a plan view illustrating another exemplary embodiment of a display substrate according to the invention.

FIG. 9 is a plan view illustrating another exemplary embodiment of a display substrate according to the invention.

Referring to FIG. 9, the display substrate of the exemplary embodiment is the substantially same as that of the previous exemplary embodiment except for the data line, the gate line and the storage line. Hereinafter, any repetitive detailed explanation will be omitted.

According the exemplary embodiment, a gate line 147 and a storage line 148 are the second conduction pattern formed from the second conductive layer, and a data line 117 is the first conduction pattern formed from the first conductive layer.

A gate electrode 112 of the switching element TR which is the first conduction pattern directly makes contact with the gate line 147 which is the second conduction pattern through a sixth contact hole CH6.

A source electrode 142 of the switching element TR which is the second conduction pattern directly makes contact with the data line 117 which is the first conduction pattern through a seventh contact hole CH7.

The gate line 147 and the source electrode 142 which are the second conduction pattern directly makes contact with the gate electrode 112 and the data line 117 through the fifth and sixth contact holes CH5 and CH6, respectively. Thus, an aperture ratio of the display panel may be improved.

In addition, the storage line 148 is the second conduction pattern formed from the second conductive layer so that a distance length between the storage line 148 and the pixel electrode 181 may be decreased. In the display panel, a storage capacitor may be defined by the storage line 148, the pixel electrode 181 and the insulating layer between the storage line 148 and the pixel electrode 181. Generally, a capacitance may be increased when the distance length between both electrodes decreases and areas of electrodes increase. According to the exemplary embodiment, the storage line 148 is the second conduction pattern so that the distance length between both electrodes may be decreased. Therefore, the capacitance of the storage capacitor may be increased so that a display quality may be improved.

FIGS. 10A to 10D are plan views illustrating an exemplary embodiment of a method of manufacturing the display substrate of FIG. 9.

A method of manufacturing the display substrate according to the exemplary embodiment is the substantially same as that of the previous exemplary embodiment except for the data line, the gate line, the storage line, the fifth contact hole and a sixth contact hole in the display area. Hereinafter, the method of manufacturing the display substrate will be explained referring to FIGS. 4A to 4N and any repetitive detailed explanation will be omitted.

Figure 10A:
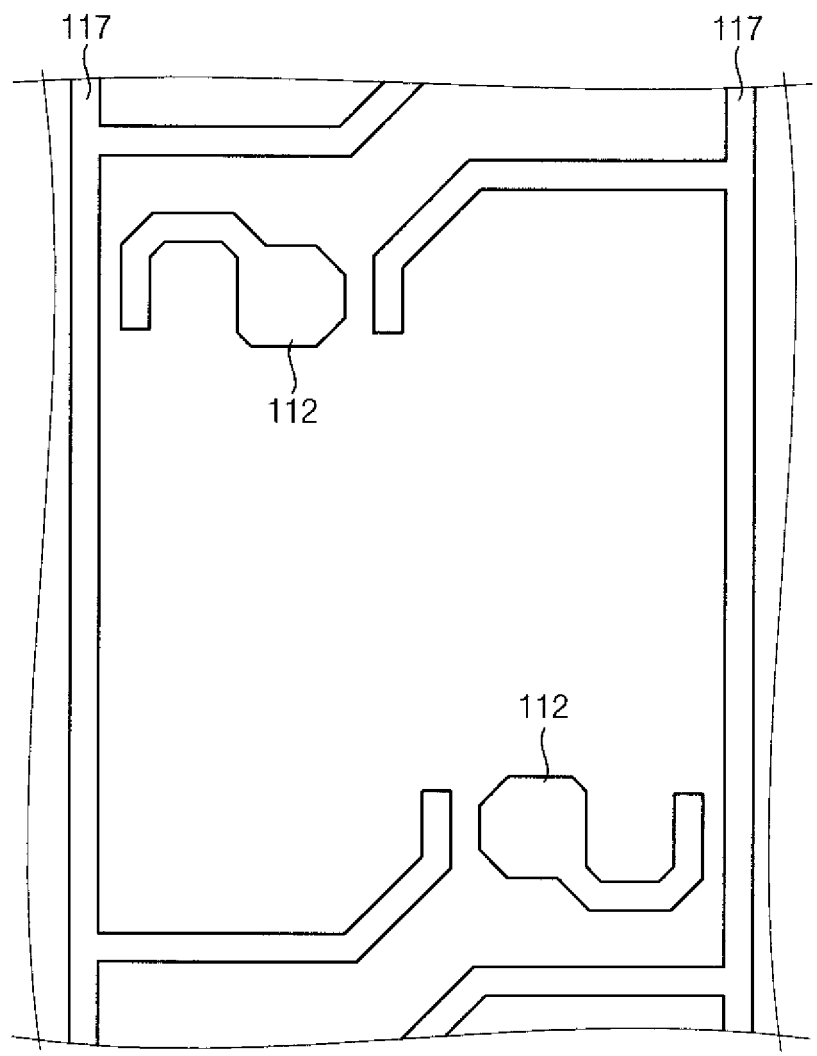
FIGS. 10A to 10D are plan views illustrating an exemplary embodiment of a method of manufacturing the display substrate of FIG. 9.

Referring to FIG. 10A, the first conduction pattern is formed on the base substrate 101 using the method shown in FIGS. 4A and 4B. The first conduction pattern includes the gate electrode 112 and the data line 117.

Figure 10B:
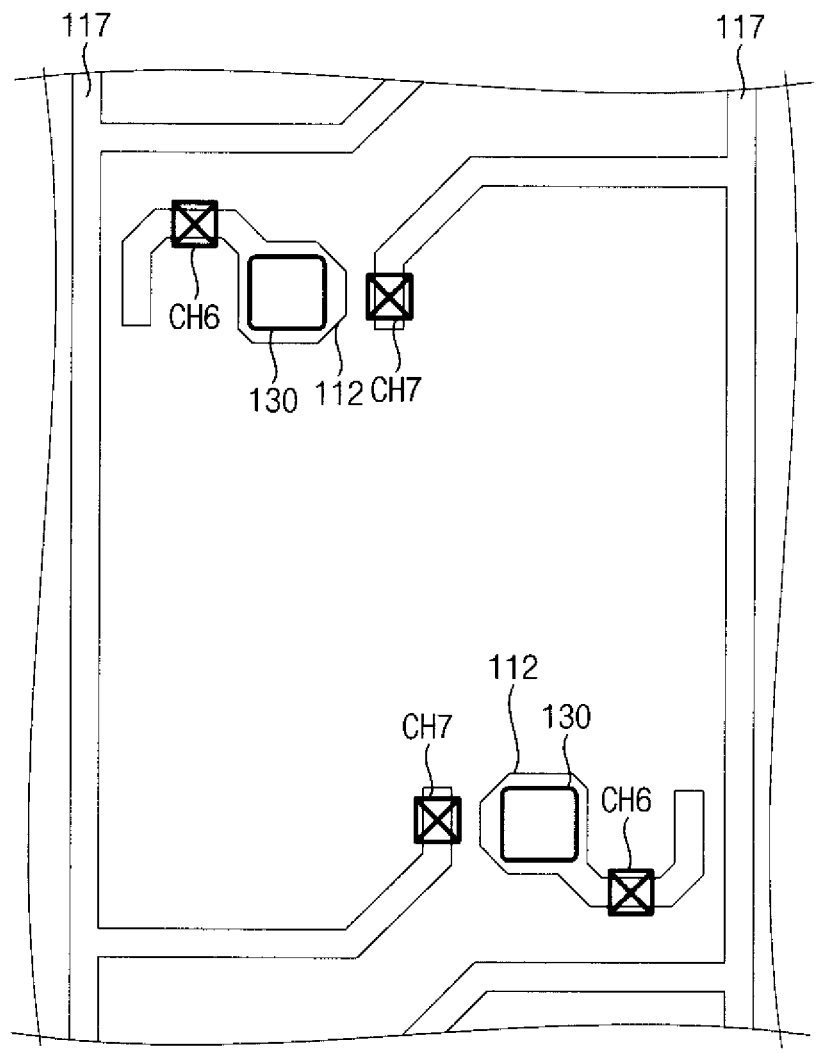

Referring to FIG. 10B, the sixth contact hole CH6, the seventh contact hole CH7 and an active pattern 130 are formed on the base substrate 101 on which the first conduction pattern is formed using the method shown in FIGS. 4C to 4F. An end of the gate electrode 112 is exposed through the sixth contact hole CH6 and an end of the data line 117 is exposed through the seventh contact hole CH7. The active pattern 130 overlaps with the gate electrode 112.

Figure 10C:
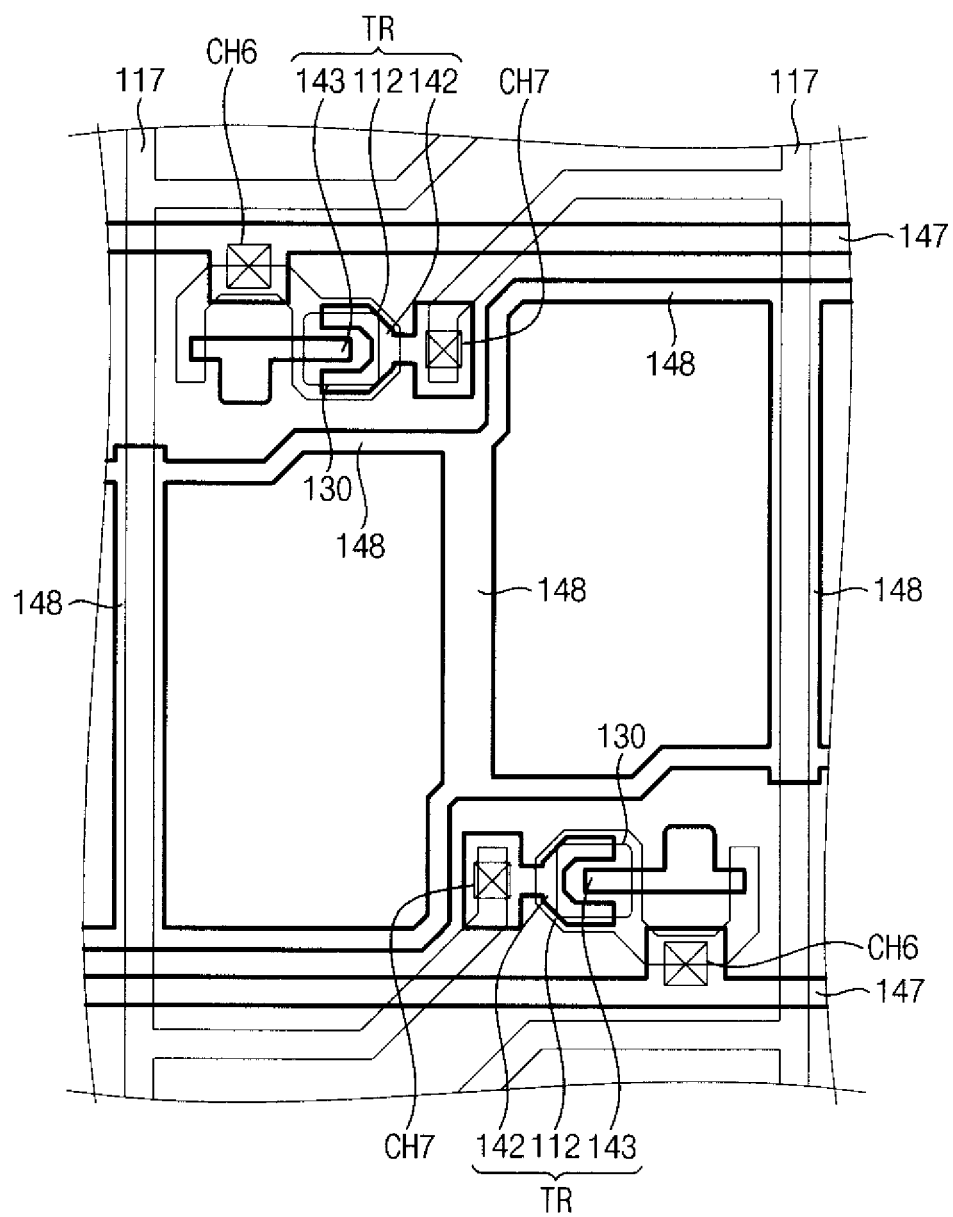

Referring to FIG. 10C, a second conduction pattern is formed on the base substrate 101 on which the sixth contact hole CH6, the seventh contact hole CH7 and the active pattern 130 are formed using the method shown in FIGS. 4G to 4J. The second conduction pattern includes the gate line 147, the storage line 148, the source electrode 142 and the drain electrode 143. The gate line 147 directly makes contact with the end of the gate electrode 112 through the sixth contact hole CH6, and the source electrode 142 directly makes contact with the end of the data line 117 through the seventh contact hole CH7.

The storage line 148 includes a first part substantially parallel to the gate line 147 and a second part overlapping with the data line 117. The source electrode 142 and the drain electrode 143 are spaced apart from each other, and partially overlap with the active pattern 130, respectively.

Figure 10D:
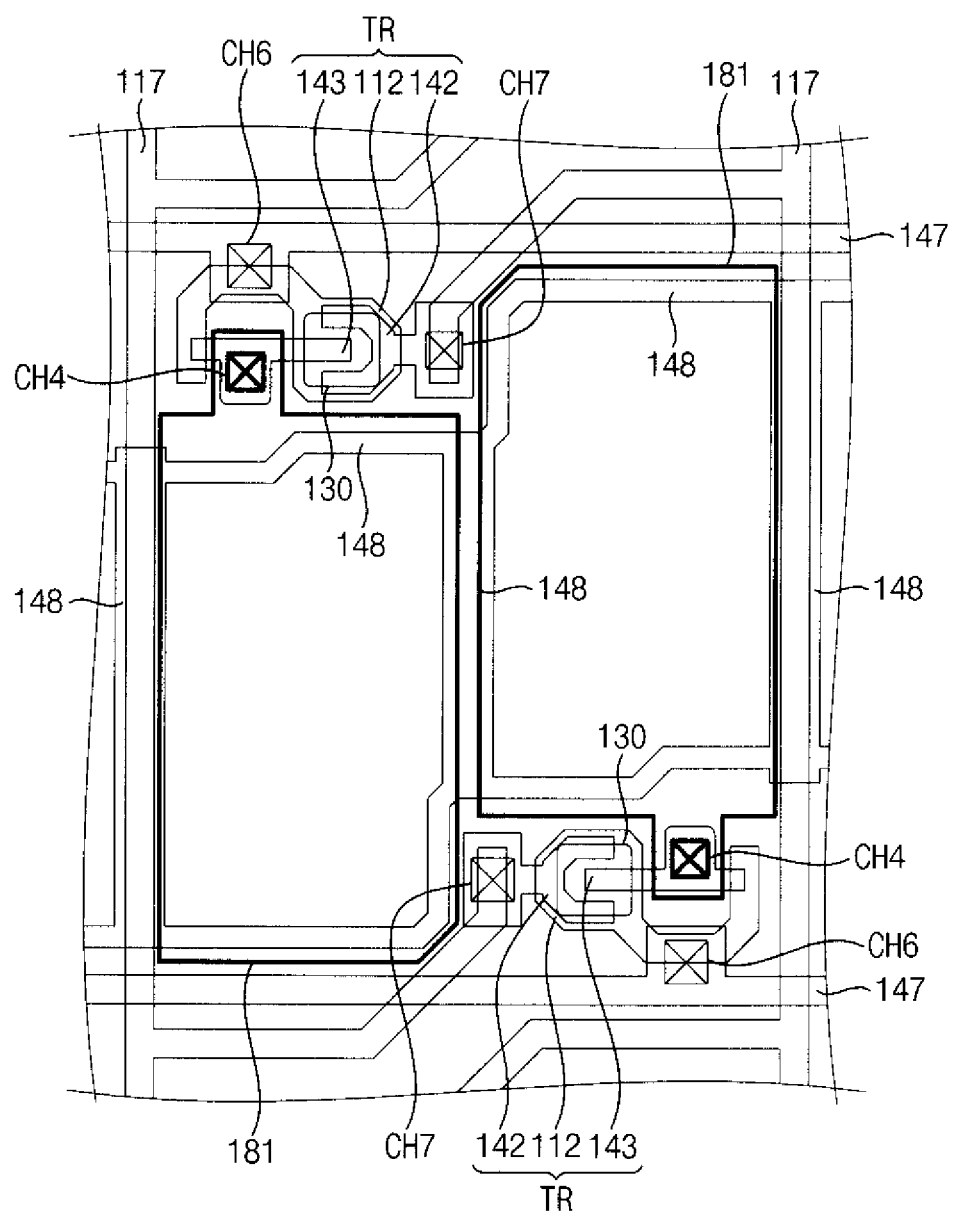

Referring to FIG. 10D, fourth contact hole CH4 and third conduction pattern are formed on the base substrate 101 on which the second conduction pattern is formed using the method shown in FIGS. 4K to 4N. The third conduction pattern includes the pixel electrode 181 and the pixel electrode 181 directly makes contact with the drain electrode 143 through the fourth contact hole CH4. The pixel electrode 181 may be formed to overlap with the storage line 148 so that the storage capacitor may be defined.

Figure 11:
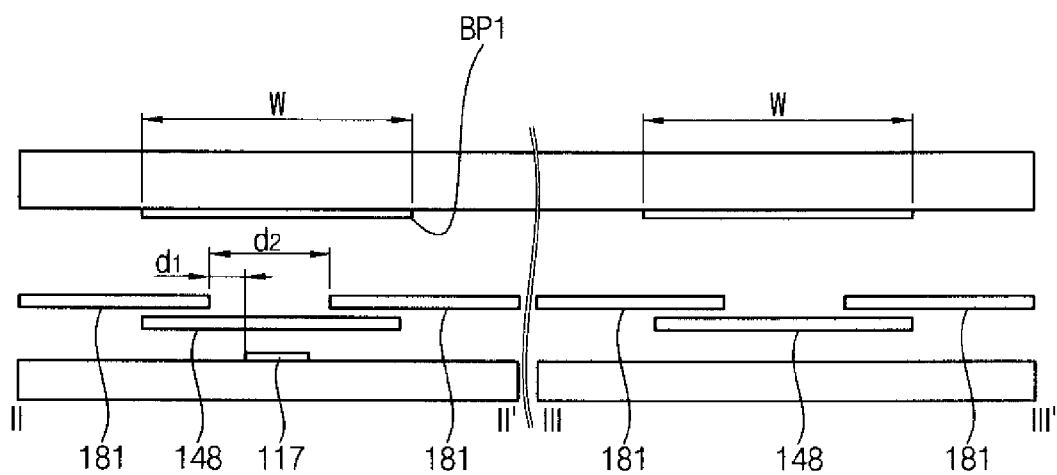
FIG. 11 is a cross-sectional view taken along line II-II' and line III-III' in FIG. 9.

FIG. 11 is a cross-sectional view taken along line II-II' and line III-III' in FIG. 9.

Referring to FIGS. 1 and 11, the data line 117 is formed from the first conductive layer and the pixel electrode 181 is formed from the third conductive layer.

A data voltage applied to the data line 117 is fluctuated in every horizontal period during a frame, but a pixel voltage applied to the pixel electrode 181 is maintained constantly during the frame. When the data line 117 and the pixel electrode 181 are disposed adjacent to each other, the pixel voltage of the pixel electrode 181 is changed by a voltage change of the data line 117 so that a display quality is decreased. To solve above-mentioned problem, the data line 117 and the pixel electrode 181 are physically spaced apart from each other so that the aperture ratio of the display panel may be decreased.

According to the exemplary embodiment, the data line 117 is formed from the first conductive layer so that a first distance length d1 between the data line 117 and the pixel electrode 181 may be decreased in comparison with the data line formed from the second conductive layer shown in FIG. 3. In addition, when the first distance length d1 may be decreased, a second distance length d2 between adjacent pixel electrodes 181 may be decreased.

Therefore, a width W of first blocking pattern BP1 included in the opposing substrate 300 corresponding to the second distance length d2 between adjacent pixel electrodes 181, may be decreased. The width W of the first blocking pattern BP1 may be decreased so that the aperture ratio of the display panel may be improved.

According to exemplary embodiments, the display substrate has a structure including a plurality of metal layers directly making contact with each other, and areas of the gate driving circuit and the fan-out part disposed in the peripheral area of the display substrate may be decreased. In addition, the distance between adjacent pixel electrodes may be decreased so that the aperture ratio of the display panel may be improved.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing a display substrate, the method comprising:
    forming a gate electrode of a switching element in a display area of a base substrate and a first conductive line of a fan-out line in a peripheral area of the base substrate, using a first conductive layer;
    forming a gate insulating layer including a first contact hole through which the first conductive line is exposed;
    forming source and drain electrodes of the switching element in the display area and on the base substrate, and a second conductive line of the fan-out line which contacts the first conductive line through the first contact hole in the peripheral area and overlapping with the first conductive line, using a second conductive layer;
    forming a protecting layer including a second contact hole through which the drain electrode is exposed; and
    forming a pixel electrode which contacts the drain electrode through the second contact hole,
    wherein the first and second conductive lines of the fan-out line connect a signal line in the display area with a pad in the peripheral area, and are each elongated to the pad to define a multi-layered structure of the fan-out line and the pad in which the first conductive line overlaps with the second conductive line.

2. The method of claim 1, wherein the first contact hole of the gate insulating layer is elongated and extends in a longitudinal direction of the fan-out line.

3. The method of claim 1, further comprising:
forming a first connection electrode which extends from a first circuit switching element of a gate driving circuit in the peripheral area, using the first conductive layer;
forming a third contact hole through which the first connection electrode is exposed through the gate insulating layer; and
forming a second connection electrode which extends from a second circuit switching element of the gate driving circuit in the peripheral area and contacts with the first connection electrode through the third contact hole, using the second conductive layer.

4. The method of claim 3, further comprising:
forming a gate line connected to the gate electrode in the display area, using the first conductive layer; and
forming a data line connected to the source electrode and crossing the gate line in the display area, using the second conductive layer.

5. The method of claim 3, further comprising:
forming a data line in the display area, using the first conductive layer;
forming a fourth contact hole through which the gate electrode is exposed and a fifth contact hole through which the data line is exposed through the gate insulating layer; and
forming a gate line which crosses the data line and contacts the gate electrode through the fourth contact hole in the display area, using the second conductive layer,
wherein the source electrode contacts the data line through the fifth contact hole.

6. The method of claim 5, fourth comprising:
forming a storage line substantially parallel to the gate line and overlapping with the data line, using the second conductive layer.

7. The method of claim 3, further comprising:
forming the gate insulating layer, a semiconductor layer and an ohmic contact layer on the base substrate on which the gate electrode is formed;
forming the first and third contact holes using a first photo resist pattern including a first photo pattern, and a second photo pattern thicker than the first photo pattern;
etching the first photo resist pattern to form a third photo pattern overlapping the gate electrode; and
forming an active pattern including the semiconductor layer and the ohmic contact layer on the gate electrode, using the third photo pattern.

8. The method of claim 7, further comprising:
forming the second conductive layer on the base substrate on which the active pattern is formed;
forming a switching electrode pattern overlapping the first conductive line, the first connection electrode and the active pattern, using a second photo resist pattern including a fourth photo pattern, and a fifth photo pattern thicker than the fourth photo pattern;
etching the second photo resist pattern to form a sixth photo pattern overlapping the switching electrode pattern; and
forming the source electrode and the drain electrode using the sixth photo pattern.

9. The method of claim 8, further comprising:
forming the protecting layer, a blocking layer and a sacrificing layer on the base substrate on which the source and drain electrodes are formed;
forming the second contact hole using a third photo resist pattern including a seventh photo pattern, and an eighth photo pattern thicker than the seventh photo pattern;
etching the third photo resist pattern to form a ninth photo pattern through which the sacrificing layer of an area in which the pixel electrode is formed, is exposed;
forming an under cut at a side of the sacrificing layer adjacent to a side of the ninth photo pattern;
forming a third conductive layer on the base substrate on which the under cut is formed; and
lifting off the ninth photo pattern using the under cut to form the pixel electrode.

10. The method of claim 8, further comprising:
forming the protecting layer on the base substrate on which the source and drain electrodes are formed;
forming a fourth photo resist pattern on the base substrate and directly on the protecting layer;
forming the second contact hole using the fourth photo resist pattern;
forming a third conductive layer on the base substrate on which the second contact hole is formed;
forming a fifth photo resist pattern on the base substrate on which the third conductive layer is formed; and
forming the pixel electrode using the fifth photo resist pattern.

11. The method of claim 7, further comprising:
forming the second conductive layer on the base substrate on which the active pattern is formed; and
forming a switching electrode pattern overlapping with the first conductive line, the first connection electrode and the active pattern, using a second photo resist pattern having a substantially uniform thickness.

12. The method of claim 11, further comprising:
forming the protecting layer and a sacrificing layer on the base substrate on which the source and drain electrodes are formed;
forming the second contact hole using a third photo resist pattern including a seventh photo pattern, and an eighth photo pattern thicker than the seventh photo pattern;
etching the third photo resist pattern to form a ninth photo pattern through which the sacrificing layer of an area in which the pixel electrode is formed, is exposed;
forming an under cut at a side of the sacrificing layer adjacent to a side of the ninth photo pattern;
forming a third conductive layer on the base substrate on which the under cut is formed; and
lifting off the ninth photo pattern using the under cut to form the pixel electrode.

13. The method of claim 3, further comprising:
forming the gate insulating layer, a semiconductor layer and an ohmic contact layer on the base substrate on which the gate electrode is formed; and
forming the first and third contact holes using a first photo resist pattern.

14. The method of claim 13, further comprising:
forming the second conductive layer on the base substrate on which the first and third contact holes are formed;
forming the first conductive line, the first connection electrode, an active pattern and a switching electrode pattern overlapping with the active pattern, using a second photo resist pattern including a fourth photo pattern, and a fifth photo pattern thicker than the fourth photo pattern;
etching the second photo resist pattern to form a sixth photo pattern on the switching electrode pattern; and
forming the source and drain electrodes using the sixth photo pattern.

15. The method of claim 4, further comprising:
forming the protecting layer and a sacrificing layer on the base substrate on which the source and drain electrodes are formed;
forming the second contact hole using a third photo resist pattern including a seventh photo pattern, and an eighth photo pattern thicker than the seventh photo pattern;
etching the third photo resist pattern to form a ninth photo pattern through which the sacrificing layer of an area in which the pixel electrode is formed, is exposed;
forming an under cut at a side surface of the sacrificing layer adjacent to a side surface of the ninth photo pattern;
forming a third conductive layer on the base substrate on which the under cut is formed; and
lifting off the ninth photo pattern using the under cut to form the pixel electrode.

\* \* \* \* \*